(12) United States Patent
Ito

(10) Patent No.: US 11,942,276 B2
(45) Date of Patent: Mar. 26, 2024

(54) FIRST-STAGE CERAMIC COLLECTIVE BOARD, SECOND-STAGE CERAMIC COLLECTIVE BOARD, MANUFACTURING METHOD FOR SECOND-STAGE CERAMIC COLLECTIVE BOARD, AND MANUFACTURING METHOD FOR MULTILAYER ELECTRONIC COMPONENT

(71) Applicant: Murata Manufacturing Co., Ltd., Nagaokakyo (JP)

(72) Inventor: Daizo Ito, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 717 days.

(21) Appl. No.: 17/168,757

(22) Filed: Feb. 5, 2021

(65) Prior Publication Data

US 2021/0166883 A1 Jun. 3, 2021

Related U.S. Application Data

(63) Continuation of application No. PCT/JP2019/031963, filed on Aug. 14, 2019.

(30) Foreign Application Priority Data

Aug. 30, 2018 (JP) .................................. 2018-161885

(51) Int. Cl.
*H01L 41/047* (2006.01)
*H01C 7/00* (2006.01)
(Continued)

(52) U.S. Cl.
CPC .............. *H01G 4/30* (2013.01); *H01C 7/008* (2013.01); *H01C 17/28* (2013.01); *H01G 4/012* (2013.01);
(Continued)

(58) Field of Classification Search
CPC ............................. H10N 30/87; H10N 30/50
(Continued)

(56) References Cited

U.S. PATENT DOCUMENTS 9,177,724 B2 11/2015 Abe et al.
2012/0073129 A1 3/2012 Abe et al.
(Continued)

FOREIGN PATENT DOCUMENTS

JP 2008235742 A 10/2008
JP 2011040531 A 2/2011
(Continued)

OTHER PUBLICATIONS

International Search Report Issued for PCT/JP2019/031963, dated Oct. 29, 2019.

(Continued)

*Primary Examiner* — Derek J Rosenau
(74) *Attorney, Agent, or Firm* — ArentFox Schiff LLP

(57) ABSTRACT

Even with the occurrence of misalignment of inner electrodes in a ceramic collective board, a multilayer electronic component is made in which inner electrodes are disposed at suitable positions. Disclosed herein are descriptions of a first-stage ceramic collective board and a second-stage ceramic collective board used for manufacturing a multilayer electronic component. The present disclosure further describes a manufacturing method for the second-stage ceramic collective board and a manufacturing method for a multilayer electronic component.

20 Claims, 16 Drawing Sheets

(51) Int. Cl.
*H01C 17/28* (2006.01)
*H01G 4/012* (2006.01)
*H01G 4/12* (2006.01)
*H01G 4/30* (2006.01)
*H10N 30/067* (2023.01)
*H10N 30/088* (2023.01)
*H10N 30/50* (2023.01)
*H10N 30/87* (2023.01)

(52) U.S. Cl.
CPC ............ *H01G 4/12* (2013.01); *H10N 30/067* (2023.02); *H10N 30/088* (2023.02); *H10N 30/50* (2023.02); *H10N 30/87* (2023.02)

(58) Field of Classification Search
USPC ........................................ 310/328, 365, 366
See application file for complete search history.

(56) References Cited

U.S. PATENT DOCUMENTS

2016/0254436 A1 9/2016 Fukuoka et al.
2016/0293831 A1 10/2016 Fukuoka et al.

FOREIGN PATENT DOCUMENTS

| JP | 2012094819 A | 5/2012 |
| JP | 2019140374 A | 8/2019 |
| WO | 2016031994 A1 | 3/2016 |

OTHER PUBLICATIONS

Written Opinion of the International Searching Authority issued for PCT/JP2019/031963, dated Oct. 29, 2019.

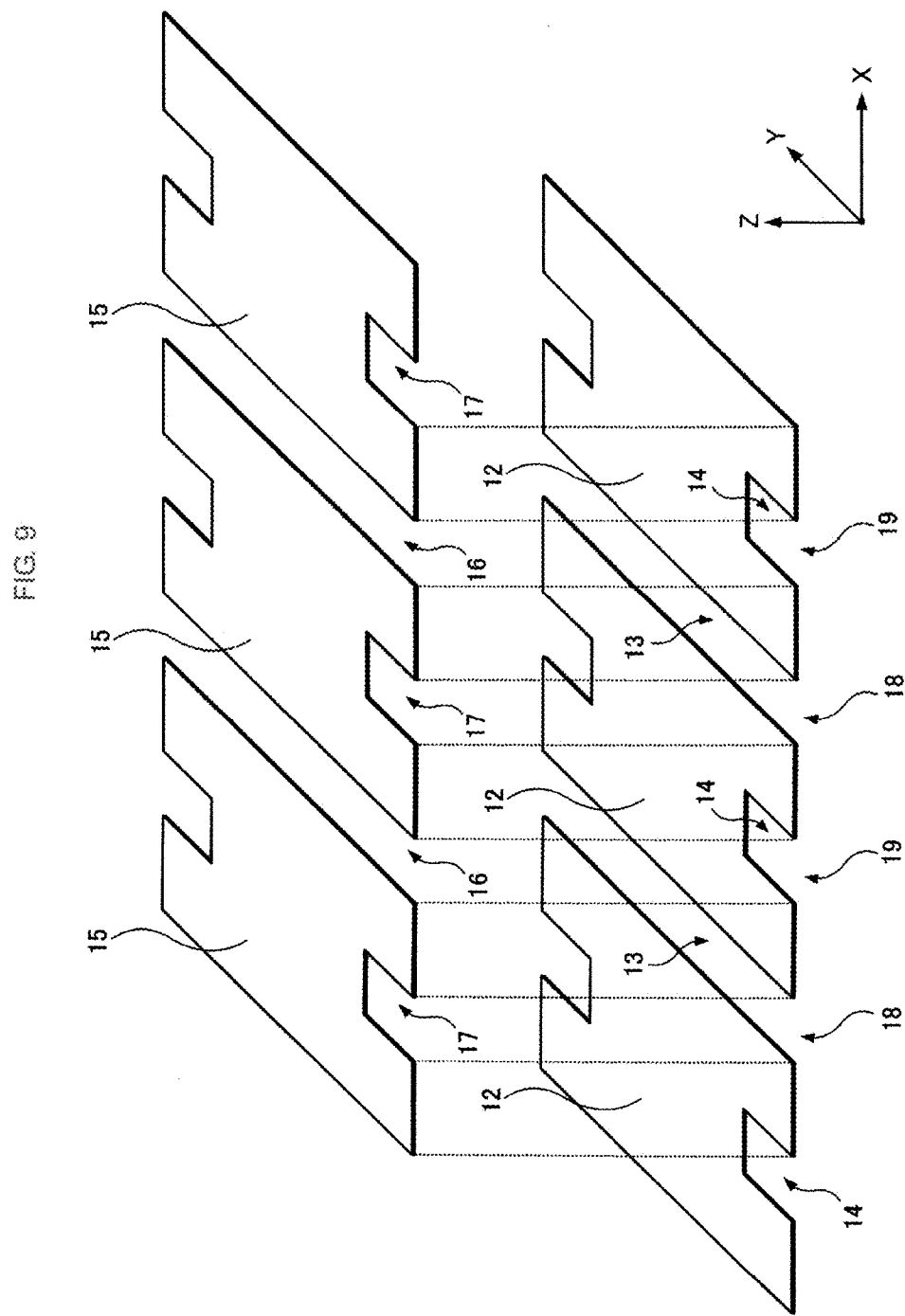

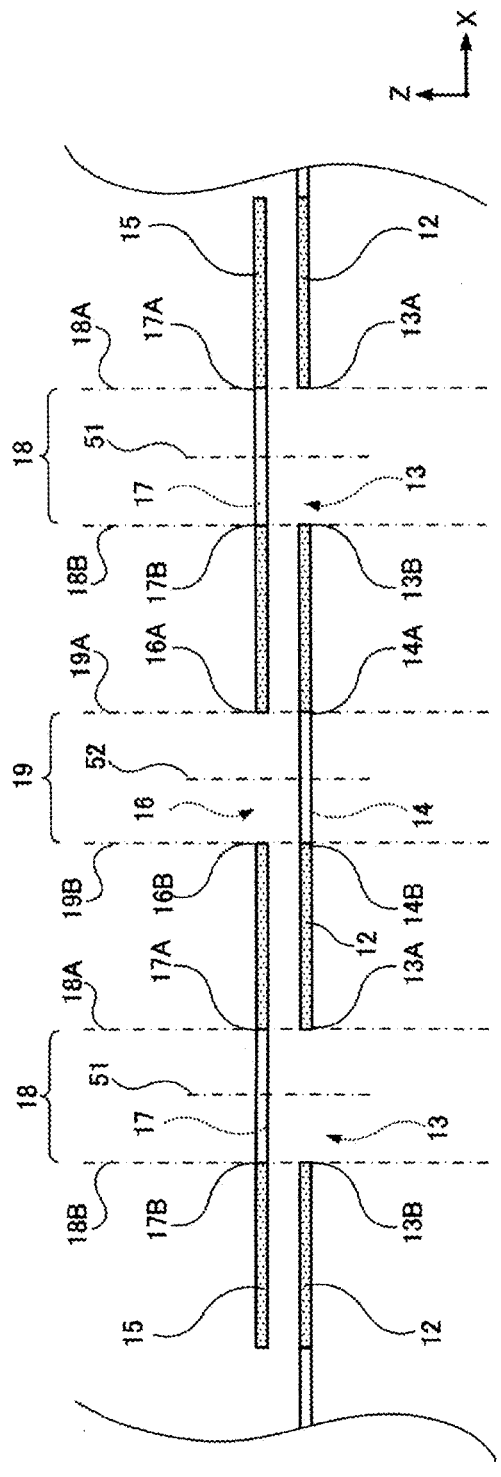
FIG. 10(A) FIRST EXAMPLE: NO MISALIGNMENT IN X DIRECTION
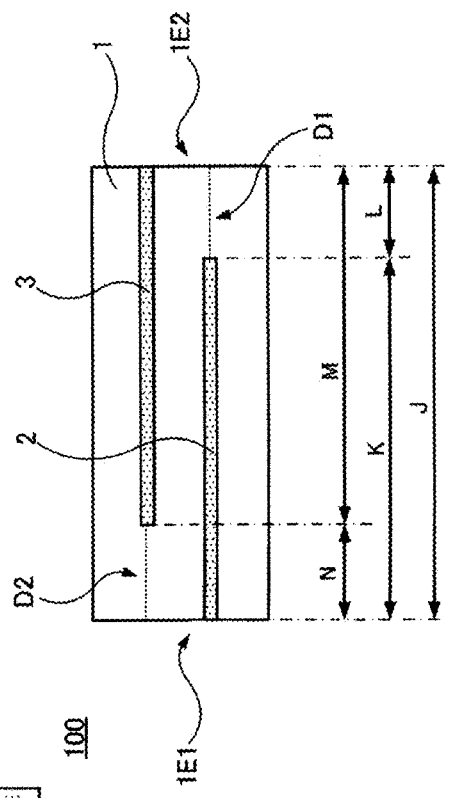
FIG. 10(B) FIRST EXAMPLE

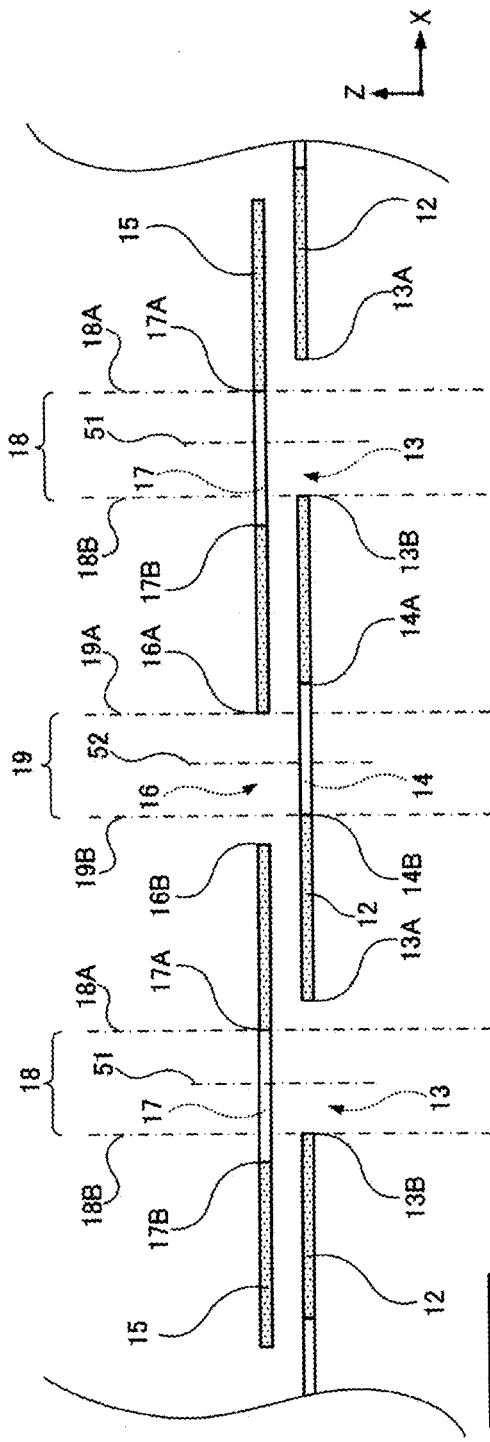
FIG. 11(A) SECOND EXAMPLE: MISALIGNMENT LENGTH α IN X DIRECTION
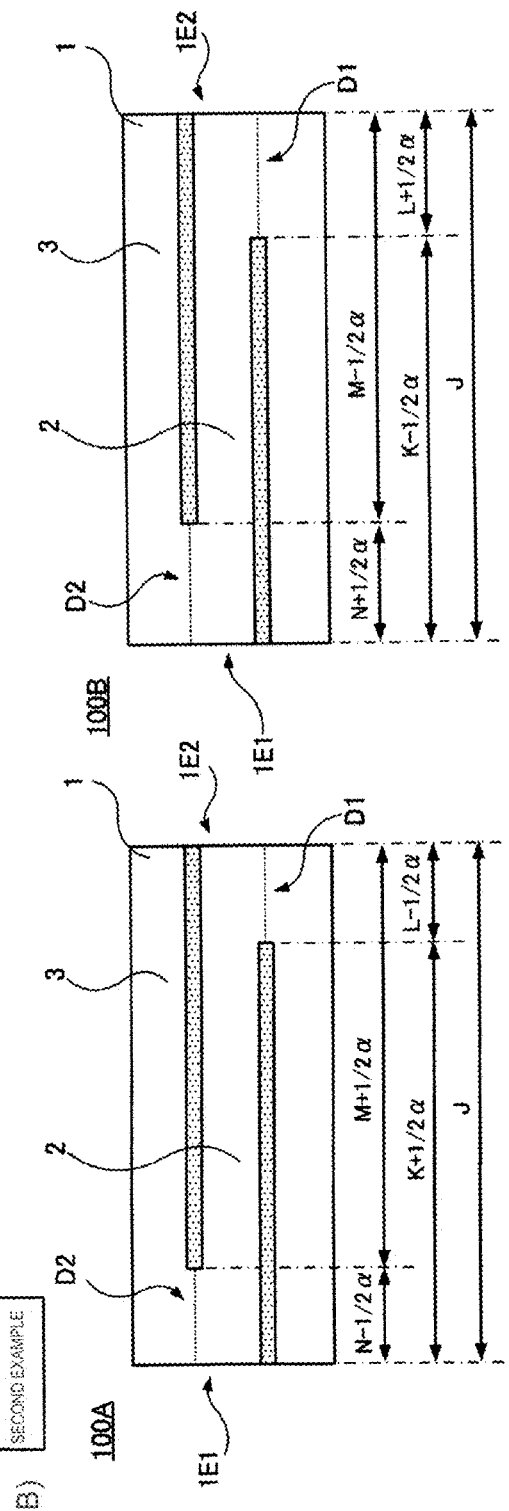
FIG. 11(B) SECOND EXAMPLE

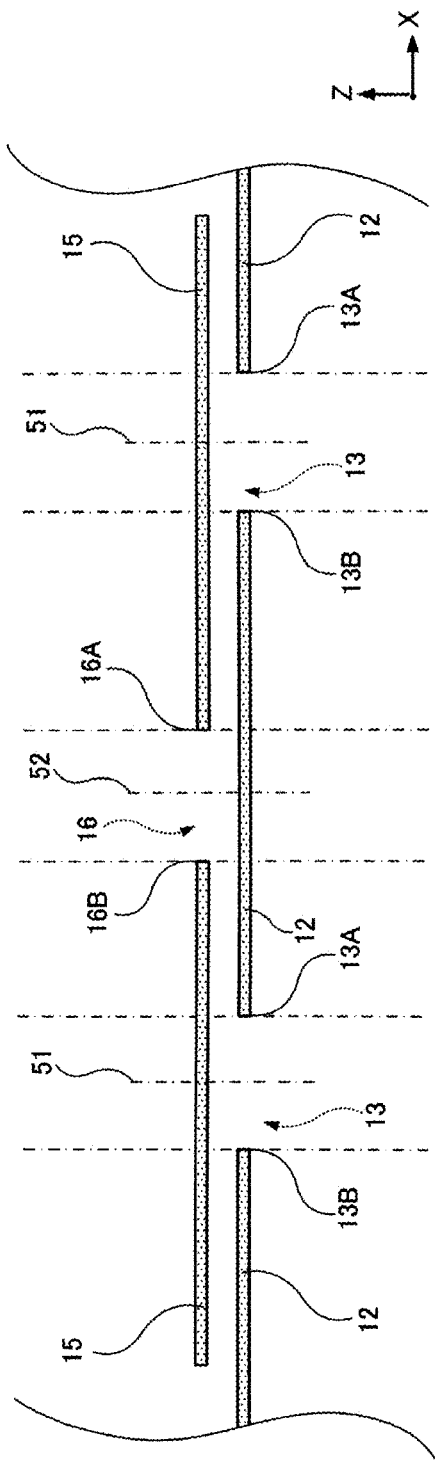
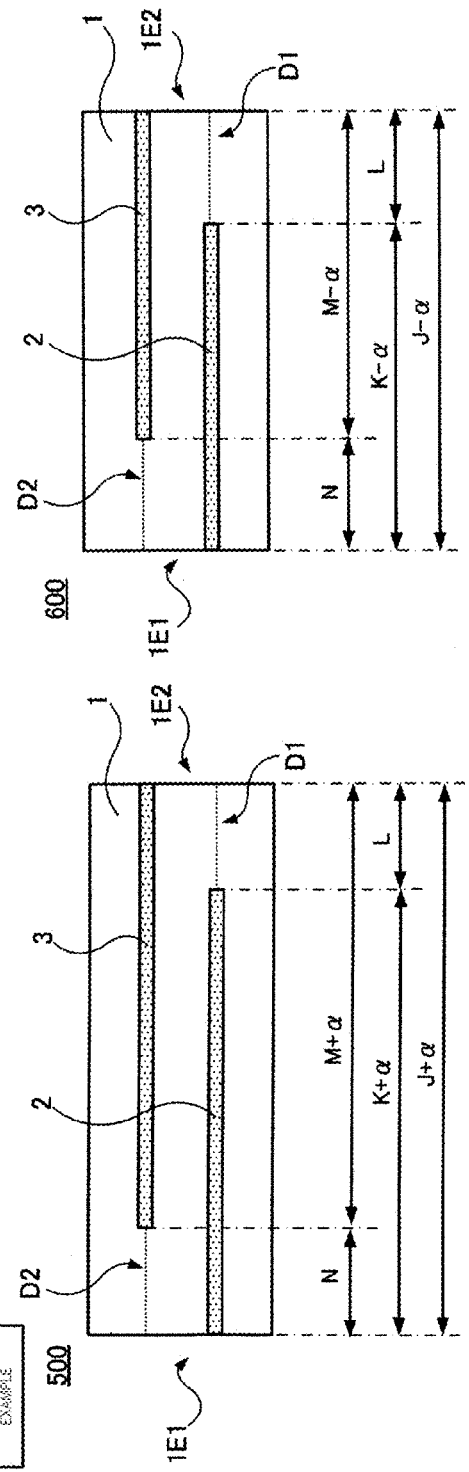
FIG. 12(A)
FIG. 12(B)

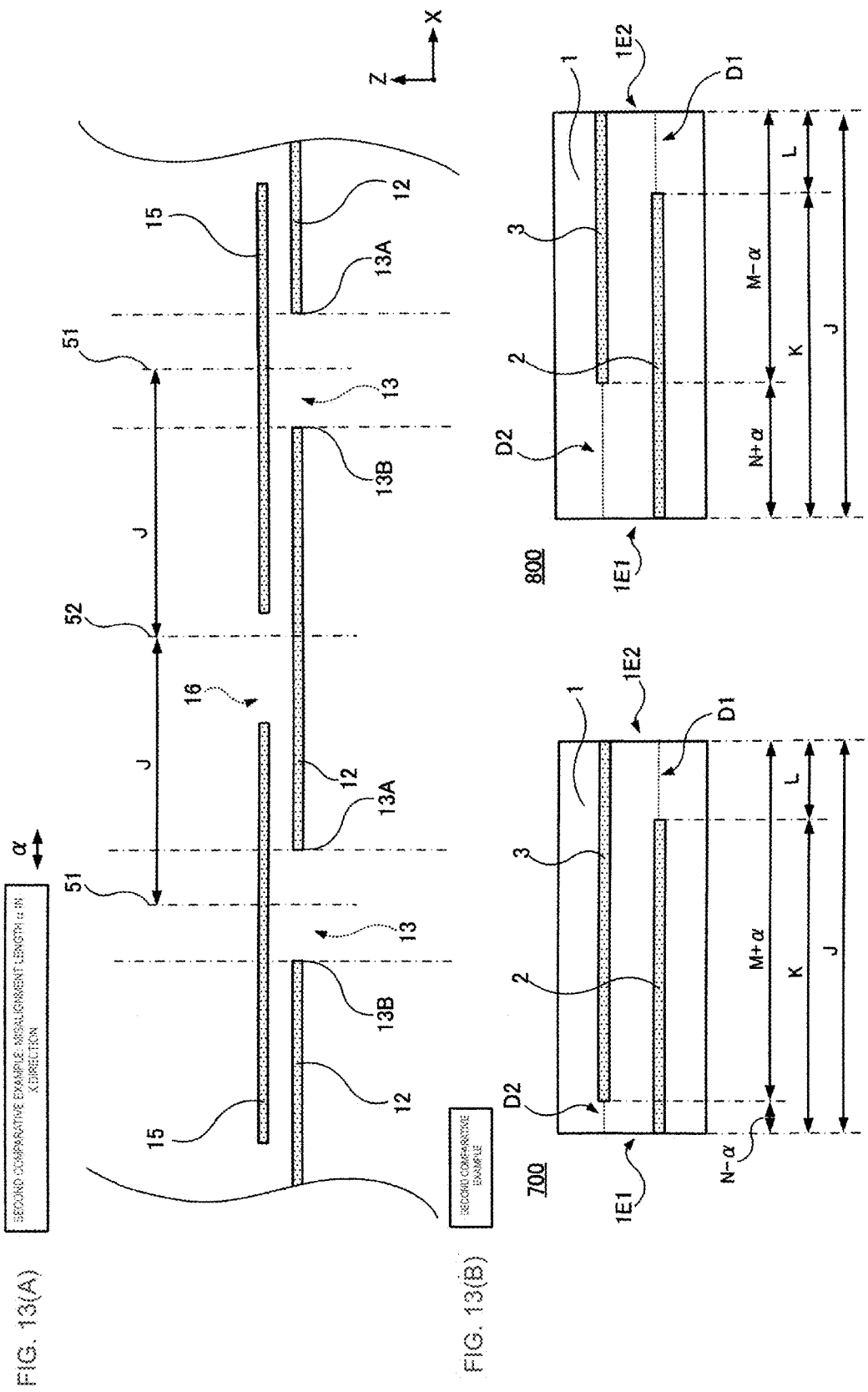

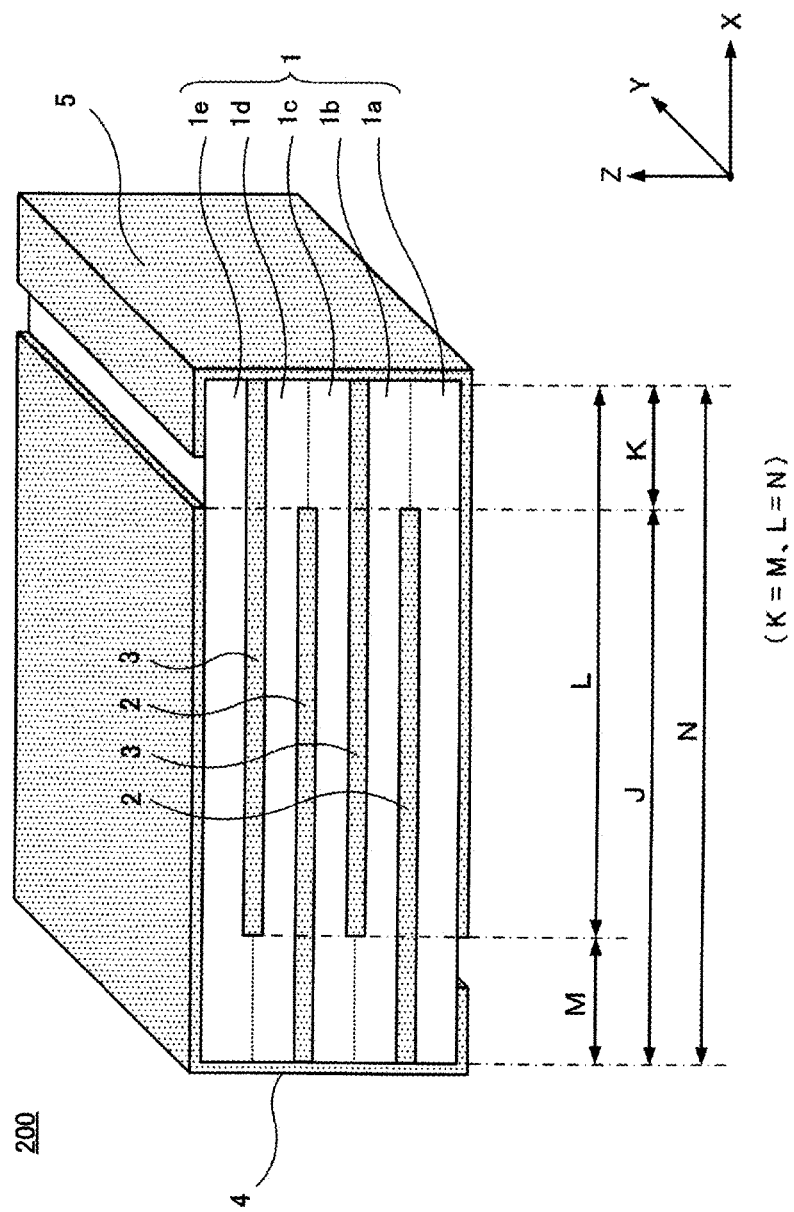

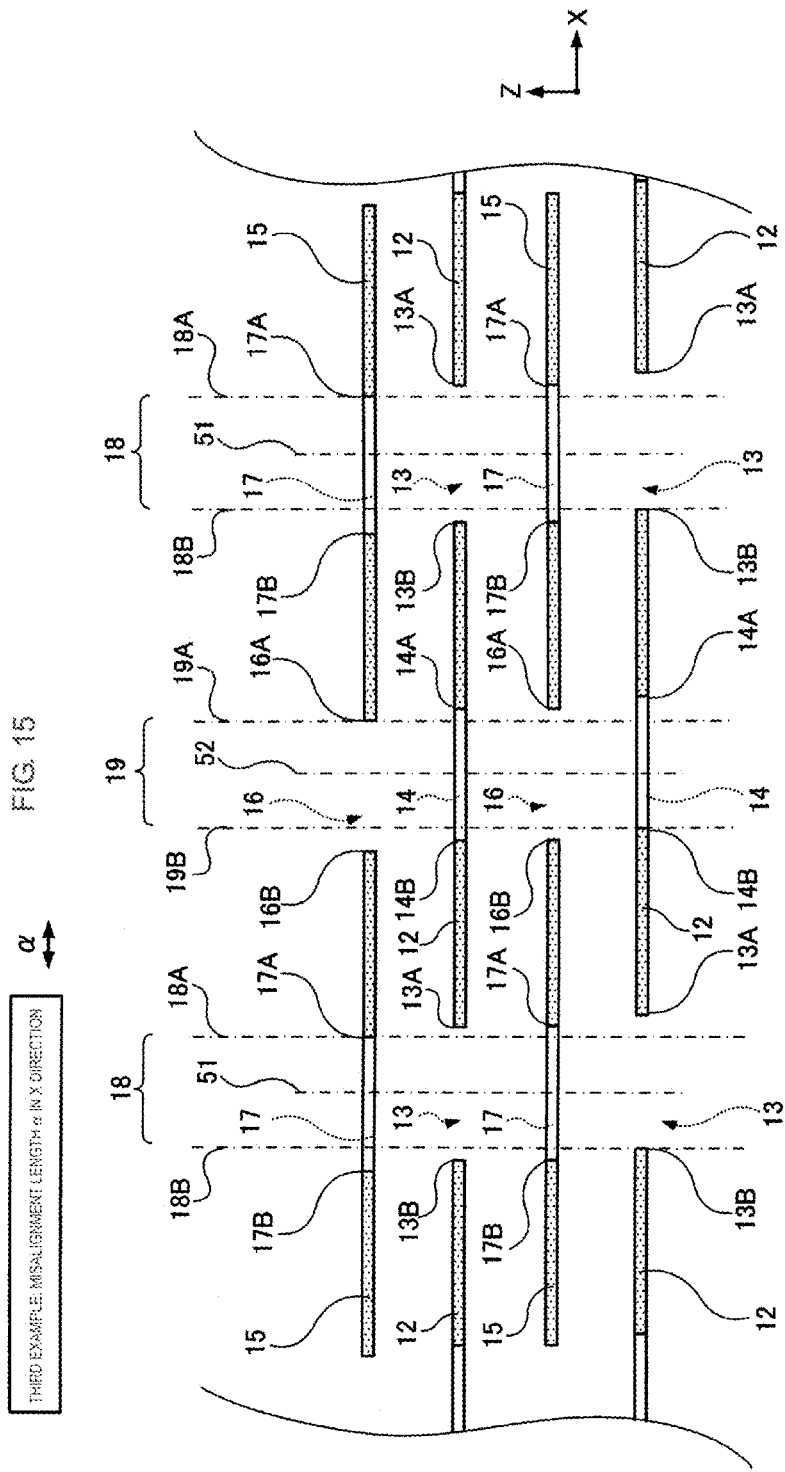

FIRST-STAGE CERAMIC COLLECTIVE BOARD, SECOND-STAGE CERAMIC COLLECTIVE BOARD, MANUFACTURING METHOD FOR SECOND-STAGE CERAMIC COLLECTIVE BOARD, AND MANUFACTURING METHOD FOR MULTILAYER ELECTRONIC COMPONENT

CROSS-REFERENCE TO RELATED APPLICATIONS

The present application is a continuation of International application No. PCT/JP2019/031963, filed Aug. 14, 2019, which claims priority to Japanese Application No. 2018-161885, filed on Aug. 30, 2018, the entire contents of each of which are incorporated herein by reference.

TECHNICAL FIELD

The present disclosure relates to the field of ceramic collective boards and more particularly to a first-stage ceramic collective board and a second-stage ceramic collective board used for manufacturing a multilayer electronic component. The present disclosure further describes a manufacturing method for the second-stage ceramic collective board and a manufacturing method for a multilayer electronic component.

BACKGROUND

To manufacture multiple multilayer electronic components together at the same time in a manufacturing process, a ceramic collective board including multiple ceramic multilayer bodies may be prepared and cut into individual ceramic multilayer bodies. Because inner electrodes are formed inside a ceramic collective board, it is necessary that cutting positions of the ceramic collective board be determined carefully.

In one approach to the manufacturing method, an image of the inside of a ceramic collective board can be taken, and after the positions of inner electrodes are checked with the image, the cutting positions can be determined. In another approach, positioning marks can be formed on the main surface of a ceramic collective board in advance. Then, an image of the ceramic collective board can be with X rays, and data indicating the association between the positions of inner electrodes and the positioning marks can be created. After the positions of the inner electrodes are checked based on the positioning marks, the cutting positions can be determined.

In both approaches, however, a large-scale device, such as an X-ray device, is required to determine the cutting positions. In a typical manufacturing method for a ceramic collective board, multiple ceramic green sheets coated with a conductive paste used for inner electrodes are stacked and pressure-bonded so as to be integrated with each other and are then fired, thereby manufacturing a ceramic collective board. It is desirable to form all the inner electrodes at correct positions in the ceramic collective board. When ceramic green sheets are stacked at high speed, however, some ceramic green sheets may be displaced out of correct positions, and in this state, the ceramic green sheets are stacked on each other. As a result, in the manufactured ceramic collective board after the firing step, the inner electrodes made from the conductive paste applied to the misaligned ceramic green sheets are located out of the correct positions. That is, misalignment of the inner electrodes occurs.

In both of the approaches described above, the cutting positions are determined without considering the possibility of occurrence of misalignment of inner electrodes. In a multilayer electronic component manufactured by these approaches, the lengths of some inner electrodes in the ceramic multilayer body may become considerably longer or shorter than the design dimension, and the length of the ceramic multilayer body may also become considerably longer or shorter than the design dimension. Additionally, in multilayer electronic components manufactured by these approaches, two types of ceramic base bodies whose dimensions, such as lengths, are different from each other may be formed together.

There thus exists a need to improve the manufacturing methods of multilayer electronic components.

SUMMARY

Aspects of the present disclosure are directed to addressing these shortcomings. To achieve the invention, a first-stage ceramic collective board according to an embodiment of the present disclosure includes a first-stage ceramic multilayer body. An X direction, a Y direction perpendicular to the X direction, and a Z direction perpendicular to both the X direction and the Y direction are used as a basis. Each of the X direction, the Y direction, and the Z direction has a positive side and a negative side. The first-stage ceramic multilayer body includes multiple first-stage ceramic layers, multiple first-stage first inner electrodes, and multiple first-stage second inner electrodes. The multiple first-stage ceramic layers extend in the X direction and the Y direction and are arranged side by side in the Z direction. The multiple first-stage first inner electrodes are disposed between a pair of first-stage ceramic layers adjacent to each other in the Z direction among the multiple first-stage ceramic layers and extend in the X direction and the Y direction and are arranged side by side in the X direction with a first gap interposed therebetween. The first gap has a width A. The multiple first-stage second inner electrodes are disposed between a pair of first-stage ceramic layers adjacent to each other in the Z direction among the multiple first-stage ceramic layers and extend in the X direction and the Y direction and are arranged side by side in the X direction with a second gap interposed therebetween. The second gap has a width B. The pair of first-stage ceramic layers sandwiching the multiple first-stage second inner electrodes is different from that sandwiching the multiple first-stage first inner electrodes. The first-stage first inner electrodes each include a first cutout on at least one of end portions in the Y direction. The first cutout extends in the X direction and the Y direction and has the width B in the X direction. The first-stage second inner electrodes each include a second cutout on at least one of end portions in the Y direction. The second cutout extends in the X direction and the Y direction and has the width A in the X direction. When the first-stage ceramic multilayer body is seen through in the Z direction, there are provided a first region where the first gap and the second cutout overlap each other and a second region where the second gap and the first cutout overlap each other.

In the above-described first-stage ceramic collective board, the width A and the width B may be equal to each other. With this configuration, a multilayer electronic component including first and second inner electrodes having the same length can be made.

A second-stage ceramic collective board according to an embodiment of the present disclosure includes a second-stage ceramic multilayer body. An X direction, a Y direction perpendicular to the X direction, and a Z direction perpendicular to the X direction and the Y direction are used as a basis. Each of the X direction, the Y direction, and the Z direction has a positive side and a negative side. The second-stage ceramic multilayer body includes multiple second-stage ceramic layers, a second-stage first inner electrode, and a second-stage second inner electrode. The multiple second-stage ceramic layers extend in the X direction and the Y direction and are arranged side by side in the Z direction. The second-stage first inner electrode is disposed between a pair of second-stage ceramic layers adjacent to each other in the Z direction among the multiple second-stage ceramic layers and extends in the X direction and the Y direction. The second-stage second inner electrode is disposed between a pair of second-stage ceramic layers adjacent to each other in the Z direction among the multiple second-stage ceramic layers and extends in the X direction and the Y direction. The pair of second-stage ceramic layers sandwiching the second-stage second inner electrode is different from that sandwiching the second-stage first inner electrode. When the second-stage ceramic multilayer body is seen through in the Z direction, a first end portion of the second-stage first inner electrode in the X direction is separated from a first end portion of the second-stage ceramic multilayer body in the X direction; at least one of end portions of the second-stage first inner electrode in the Y direction at a second end portion of the second-stage first inner electrode in the X direction is separated from a second end portion of the second-stage ceramic multilayer body in the X direction; a central portion of the second-stage first inner electrode in the Y direction at the second end portion of the second-stage first inner electrode in the X direction overlaps the second end portion of the second-stage ceramic multilayer body in the X direction; at least one of end portions of the second-stage second inner electrode in the Y direction at a first end portion of the second-stage second inner electrode in the X direction is separated from the first end portion of the second-stage ceramic multilayer body in the X direction; a central portion of the second-stage second inner electrode in the Y direction at the first end portion of the second-stage second inner electrode in the X direction overlaps the first end portion of the second-stage ceramic multilayer body in the X direction; and a second end portion of the second-stage second inner electrode in the X direction is separated from the second end portion of the second-stage ceramic multilayer body in the X direction.

A manufacturing method for a second-stage ceramic collective board according to an embodiment of the present disclosure incudes a step of making a first-stage ceramic collective board and a step of making a second-stage ceramic collective board. An X direction, a Y direction perpendicular to the X direction, and a Z direction perpendicular to the X direction and the Y direction are used as a basis. Each of the X direction, the Y direction, and the Z direction has a positive side and a negative side. The first-stage ceramic collective board includes a first-stage ceramic multilayer body. The first-stage ceramic multilayer body includes multiple first-stage ceramic layers, multiple first-stage first inner electrodes, and multiple first-stage second inner electrodes. The multiple first-stage ceramic layers extend in the X direction and the Y direction and are arranged side by side in the Z direction. The multiple first-stage first inner electrodes are disposed between a pair of first-stage ceramic layers adjacent to each other in the Z direction among the multiple first-stage ceramic layers and extend in the X direction and the Y direction and are arranged side by side in the X direction with a first gap interposed therebetween. The first gap has a width A. The multiple first-stage second inner electrodes are disposed between a pair of first-stage ceramic layers adjacent to each other in the Z direction among the multiple first-stage ceramic layers and extend in the X direction and the Y direction and are arranged side by side in the X direction with a second gap interposed therebetween. The second gap has a width B. The pair of first-stage ceramic layers sandwiching the multiple first-stage second inner electrodes is different from that sandwiching the multiple first-stage first inner electrodes. The first-stage first inner electrodes each include a first cutout on at least one of end portions in the Y direction. The first cutout extends in the X direction and the Y direction and has the width B in the X direction. The first-stage second inner electrodes each include a second cutout on at least one of end portions in the Y direction. The second cutout extends in the X direction and the Y direction and has the width A in the X direction. When the first-stage ceramic multilayer body is seen through in the Z direction, there are provided a first region where the first gap and the second cutout overlap each other and a second region where the second gap and the first cutout overlap each other. The second-stage ceramic collective board is obtained by dividing the first-stage ceramic collective board into multiple portions in the Y direction. The second-stage ceramic collective board includes a second-stage ceramic multilayer body constituted by multiple second-stage ceramic layers stacked on each other. In the second-stage ceramic collective board, a second-stage first inner electrode is formed between at least one pair of second-stage ceramic layers of the second-stage ceramic multilayer body, and a second-stage second inner electrode is formed between at least one pair of second-stage ceramic layers of the second-stage ceramic multilayer body. The at least one pair of second-stage ceramic layers sandwiching the second-stage first inner electrode is different from the at least one pair of second-stage ceramic layers sandwiching the second-stage second inner electrode. When the first-stage ceramic collective board is seen through in the Z direction, the first region includes a first-region positive side and a first-region negative side, the first-region positive side extending in the Y direction and being positioned on the positive side in the X direction, the first-region negative side extending in the Y direction and being positioned on the negative side in the X direction; the second region includes a second-region positive side and a second-region negative side, the second-region positive side extending in the Y direction and being positioned on the positive side in the X direction, the second-region negative side extending in the Y direction and being positioned on the negative side in the X direction; an imaginary line positioned at an equal distance from the first-region positive side and from the first-region negative side and extending in the Y direction is set to be a first cutting line; and an imaginary line positioned at an equal distance from the second-region positive side and from the second-region negative side and extending in the Y direction is set to be a second cutting line. The second-stage ceramic collective board is obtained by cutting the first-stage ceramic collective board into multiple portions in the Y direction along the first cutting line and the second cutting line. As a result of dividing a second-stage ceramic collective board manufactured by the manufacturing method of the present disclosure, a multilayer electronic component can be manufactured.

With the use of the first-stage ceramic collective board and the second-stage ceramic collective board of the present disclosure, even with the occurrence of misalignment of inner electrodes in the first-stage ceramic collective board, a multilayer electronic component including inner electrodes having suitable lengths can be made. Moreover, in completed multilayer electronic components, there are less variations in the lengths of ceramic multilayer bodies. According to the manufacturing method of a multilayer electronic component of the present disclosure, a multilayer electronic component can be made in which inner electrodes are disposed at suitable positions.

The above simplified summary of example aspects serves to provide a basic understanding of the present disclosure. This summary is not an extensive overview of all contemplated aspects, and is intended to neither identify key or critical elements of all aspects nor delineate the scope of any or all aspects of the present disclosure. Its sole purpose is to present one or more aspects in a simplified form as a prelude to the more detailed description of the disclosure that follows. To the accomplishment of the foregoing, the one or more aspects of the present disclosure include the features described and exemplarily pointed out in the claims.

BRIEF DESCRIPTION OF THE DRAWINGS

The accompanying drawings, which are incorporated into and constitute a part of this specification, illustrate one or more example aspects of the present disclosure and, together with the detailed description, serve to explain their principles and implementations.

FIG. 9 is a perspective view illustrating the positional arrangement of first-stage first inner electrodes 12 and first-stage second inner electrodes 15;

FIG. 10(a) is a front view illustrating the positional arrangement of the first-stage first inner electrodes 12 and the first-stage second inner electrodes 15 in a first example;

FIG. 10(b) is a front view of the multilayer electronic component 100 in the first example;

FIG. 11(a) is a front view illustrating the positional arrangement of the first-stage first inner electrodes 12 and the first-stage second inner electrodes 15 in a second example;

FIG. 11(b) shows front views of multilayer electronic components 100 in the second example;

FIG. 12(a) is a front view illustrating the positional arrangement of the first-stage first inner electrodes 12 and the first-stage second inner electrodes 15 in a first comparative example;

FIG. 12(b) shows front views of multilayer electronic components 500 and 600 in the first comparative example;

FIG. 13(a) is a front view illustrating the positional arrangement of the first-stage first inner electrodes 12 and the first-stage second inner electrodes 15 in a second comparative example;

FIG. 13(b) shows front views of multilayer electronic components 700 and 800 in the second comparative example;

FIG. 14 is a perspective view of a multilayer electronic component 200 according to a second embodiment;

FIG. 15 is a front view illustrating the positional arrangement of the first-stage first inner electrodes 12 and the first-stage second inner electrodes 15 in a third example;

DETAILED DESCRIPTION

Figure 1:
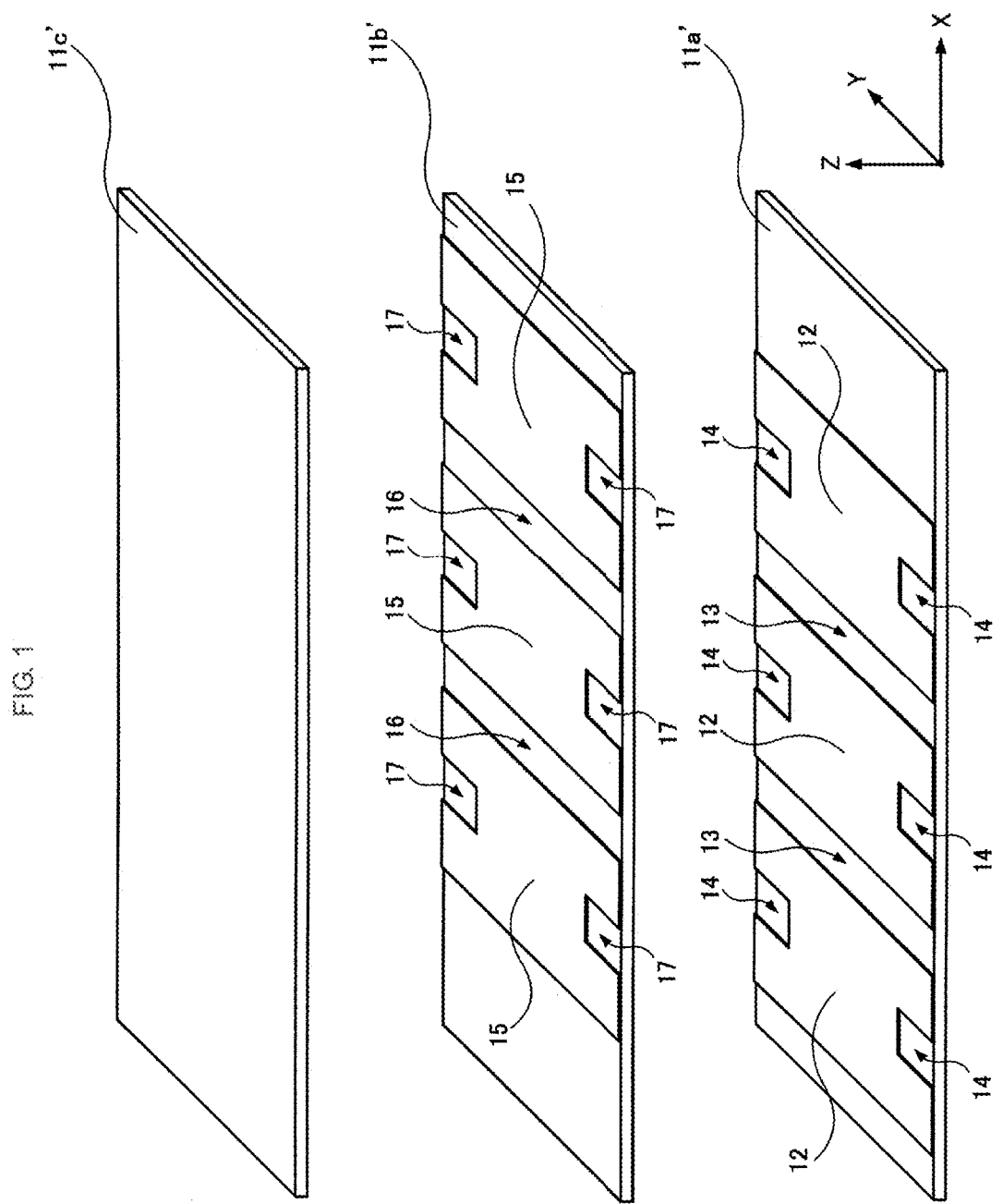
FIG. 1 is a perspective view showing a step performed in an example of a manufacturing method for a multilayer electronic component 100 according to a first embodiment.

Hereinafter, embodiments of the present disclosure will be described below with reference to the drawings. The individual embodiments merely illustrate examples of embodiments of the disclosure, and the disclosure is not restricted thereto. Different embodiments may suitably be combined with each other and be carried out, and the content of such a combined embodiment is encompassed within the disclosure. The drawings are provided for the better understanding of the specification and some drawings are only schematically shown. The size ratio of each component or the size ratio of one component to another component shown in the drawings may not match that described in the specification. Some components described in the specification may not be shown in the drawings, or a component shown in a drawing may not be as many as that described in the specification.

First Embodiment

A manufacturing method for a multilayer electronic component 100 according to a first embodiment is shown in FIGS. 1 through 7. FIGS. 1 through 7 are perspective views showing individual steps performed in this embodiment. The perspective view of FIG. 7 also illustrates the completed multilayer electronic component 100.

In the perspective views in FIGS. 1 through 7, the left-right direction is the X direction, the front-back direction is the Y direction, and the top-bottom direction is the Z direction. In the X direction, the right direction is the positive side, while the left direction is the negative side. In the Y direction, the back direction is the positive side, while the front direction is the negative side. In the Z direction, the top direction is the positive side, while the bottom direction is the negative side.

In FIGS. 1 through 7, the X direction, the Y direction, and the Z direction are indicated by the arrows. The head of each arrow indicates the positive side, while the tail of each arrow indicates the negative side.

In this embodiment, a multilayer piezoelectric actuator is made as the multilayer electronic component 100. However, the type of multilayer electronic component to be made in the disclosure is not limited to a multilayer piezoelectric actuator and may be another type, such as a multilayer ceramic capacitor and a multilayer thermistor.

Figure 7:
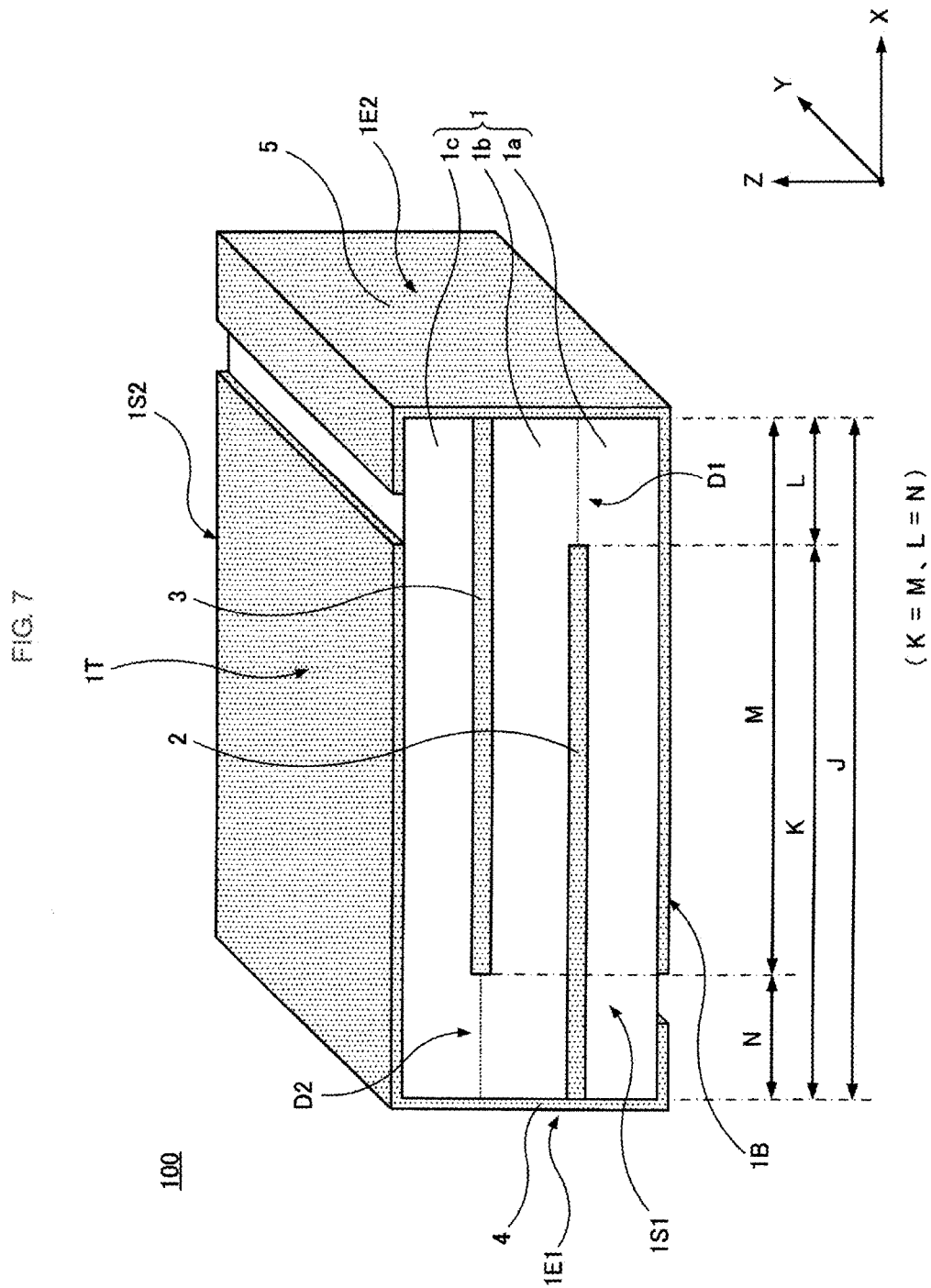
FIG. 7 is a perspective view showing a step subsequent to the step in FIG. 6 performed in the manufacturing method for the multilayer electronic component 100.

Reference is first made to FIG. 7 to discuss the completed multilayer electronic component (multilayer piezoelectric actuator) 100 made in this embodiment.

The multilayer electronic component 100 includes a ceramic multilayer body 1 having three ceramic layers 1a, 1b, and 1c. The ceramic layers 1a, 1b, and 1c are each made of piezoelectric ceramics and are stacked on each other. The ceramic multilayer body 1 has a first main surface (bottom main surface) 1B and a second main surface (top main surface) 1T. The ceramic multilayer body 1 also has a pair of side surfaces 1S1 and 1S2 and a pair of end surfaces 1E1 and 1E2 that link the first main surface 1B and the second main surface 1T.

The ceramic layers 1a, 1b, and 1c are polarized in the thickness direction. In this embodiment, the ceramic layers 1a and 1c are polarized in the same direction, while the polarization direction of the ceramic layers 1a and 1c is opposite that of the ceramic layer 1b.

The ceramic multilayer body 1 has a length J in the direction in which the end surfaces 1E1 and 1E2 oppose each other. The length J is a design dimension.

A first inner electrode 2 is provided between the ceramic layers 1a and 1b. In the first inner electrode 2, the end portion on the negative side of the X direction reaches the end surface 1E1 of the ceramic multilayer body 1, while the end portion on the positive side in the X direction does not reach the end surface 1E2. The first inner electrode 2 has a length K in the X direction. A distance D1 having a length L is provided between the end portion of the first inner electrode 2 on the positive side in the X direction and the end surface 1E2 of the ceramic multilayer body 1. The lengths K and L are design dimensions.

A second inner electrode 3 is provided between the ceramic layers 1b and 1c. In the second inner electrode 3, the end portion on the positive side of the X direction reaches the end surface 1E2 of the ceramic multilayer body 1, while the end portion on the negative side in the X direction does not reach the end surface 1E1. The second inner electrode 3 has a length M in the X direction. A distance D2 having a length N is provided between the end portion of the second inner electrode 3 on the negative side in the X direction and the end surface 1E1 of the ceramic multilayer body 1. The lengths M and N are design dimensions.

In this embodiment, the length K of the first inner electrode 2 and the length M of the second inner electrode 3 are designed to be equal to each other. The length L of the distance D1 and the length N of the distance D2 are also designed to be equal to each other.

Any suitable material may be used for the first inner electrode 2 and the second inner electrode 3. For example, a metal, such as AgPd or Pt, may be used.

A first outer electrode 4 is provided on the end surface 1E1 of the ceramic multilayer body 1. The first outer electrode 4 is partly disposed also on the first main surface 1B and the second main surface 1T of the ceramic multilayer body 1. The first inner electrode 2 is connected to the first outer electrode 4.

A second outer electrode 5 is provided on the end surface 1E2 of the ceramic multilayer body 1. The second outer electrode 5 is partly disposed also on the first main surface 1B and the second main surface 1T of the ceramic multilayer body 1. The second inner electrode 3 is connected to the second outer electrode 5.

Any suitable structure and material may be used for the first and second outer electrodes 4 and 5. Each of the first and second outer electrodes 4 and 5 may be formed in a double layer structure in which a first layer is made of NiCr and a second layer is made of Au.

In the multilayer electronic component (multilayer piezoelectric actuator) 100, the ceramic multilayer body 1 is bent as a result of applying a voltage to between the first outer electrode 4 and the second outer electrode 5.

An example of the manufacturing method for the multilayer electronic component 100 will be described below.

To make multiple ceramic multilayer bodies 1 together at the same time, a first-stage ceramic collective board is first formed.

In the specification of this application, the ceramic collective board which is initially made may be called a first-stage ceramic collective board, while multiple ceramic collective boards produced by cutting the first-stage ceramic collective board may be called second-stage ceramic collective boards.

First of all, three mother green sheets 11a', 11b', and 11c' are prepared, as shown in FIG. 1, and are each formed as follows. A slurry is first prepared by mixing piezoelectric ceramic powder, a binder, and a solvent, for example, and is then formed into a sheet by doctor blading, for example. The mother green sheets 11a', 11b', and 11c' each have a rectangular shape as viewed from above and extend in the X and Y directions.

Figure 8:
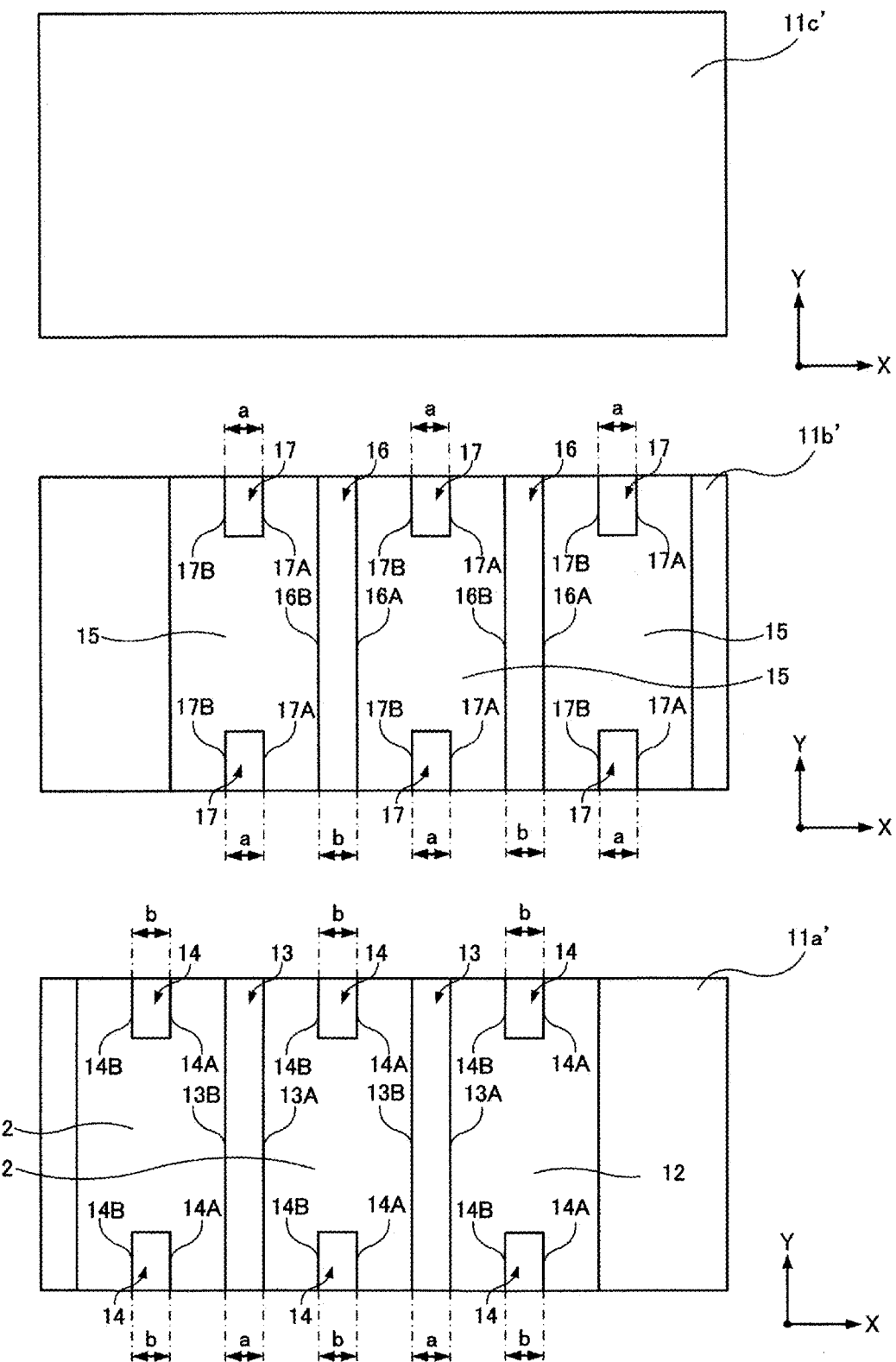
FIG. 8 is a plan view of mother green sheets 11a', 11b', and 11c.

The plan view of each of the mother green sheets 11a', 11b', and 11c' is shown in FIG. 8. In FIG. 8, the left-right direction is the X direction, and the top-bottom direction is the Y direction.

Three first-stage first inner electrodes 12 are formed on the top main surface of the mother green sheet 11a' by applying a conductive paste thereto in a predetermined shape. Each of the first-stage first inner electrodes 12 is formed in a rectangular shape as viewed from above and has a pair of sides extending in the X direction and a pair of sides extending in the Y direction.

Each of the first-stage first inner electrodes 12 is disposed next to another first-stage first inner electrode 12 with a first gap 13 interposed therebetween. The first gap 13 has a width A and extends in the Y direction. The first gap 13 has a negative side 13B positioned on the negative side in the X direction and a positive side 13A positioned on the positive side in the X direction.

A first cutout 14 is formed at the central portion of each side extending in the X direction of each first-stage first inner electrode 12. The first cutout 14 is formed in a rectangular shape as viewed from above and has a width B and extends in the Y direction. The first cutout 14 has a positive side 14A positioned on the positive side in the X direction and a negative side 14B positioned on the negative side in the X direction.

Likewise, three first-stage second inner electrodes 15 are formed on the top main surface of the mother green sheet 11b' by applying a conductive paste thereto in a predetermined shape. Each of the first-stage second inner electrodes 15 is formed in a rectangular shape as viewed from above and has a pair of sides extending in the X direction and a pair of sides extending in the Y direction.

Each of the first-stage second inner electrodes 15 is disposed next to another first-stage second inner electrode 15 with a second gap 16 interposed therebetween. The second gap 16 has a width B and extends in the Y direction. The second gap 16 has a negative side 16B positioned on the negative side in the X direction and a positive side 16A positioned on the positive side in the X direction.

A second cutout 17 is formed at the central portion of each side extending in the X direction of each first-stage second inner electrode 15. The second cutout 17 is formed in a rectangular shape as viewed from above and has a width A and extends in the Y direction. The second cutout 17 has a positive side 17A positioned on the positive side in the X direction and a negative side 17B positioned on the negative side in the X direction.

In this embodiment, the length K of the first inner electrode 2 and the length M of the second inner electrode 3 are designed to be equal to each other. The length L of the distance D1 and the length N of the distance D2 are also designed to be equal to each other. In this embodiment, the width A of the first gap 13 and the width A of the second cutout 17 is accordingly equal to the width B of the first cutout 14 and the width B of the second gap 16. That is, the width A is equal to the width B.

The first-stage first inner electrodes 12 are formed on the top main surface of the mother green sheet 11a' and the first-stage second inner electrodes 15 are formed on the top main surface of the mother green sheet 11b' with a very high dimensional accuracy by screen printing, for example. In the mother green sheet 11a', the first-stage first inner electrodes 12, the first gaps 13, and the first cutouts 14 are individually formed in predetermined shapes with predetermined dimensions at predetermined positions almost without errors. Likewise, in the mother green sheet 11b', the first-stage second inner electrodes 15, the second gaps 16, and the second cutouts 17 are individually formed in predetermined shapes with predetermined dimensions at predetermined positions almost without errors.

Then, the mother green sheet 11a' having the first-stage first inner electrodes 12 formed on its top main surface, the mother green sheet 11b' having the first-stage second inner electrodes 15 formed on its top main surface, and the mother green sheet 11c' are stacked in the Z direction and are pressure-bonded so as to be integrated with each other. When stacking the mother green sheets, the mother green sheet 11b' is positioned on the mother green sheet 11a' so that the first gaps 13 and the second cutouts 17 overlap each other and the second gaps 16 and the first cutouts 14 overlap each other.

Figure 2:
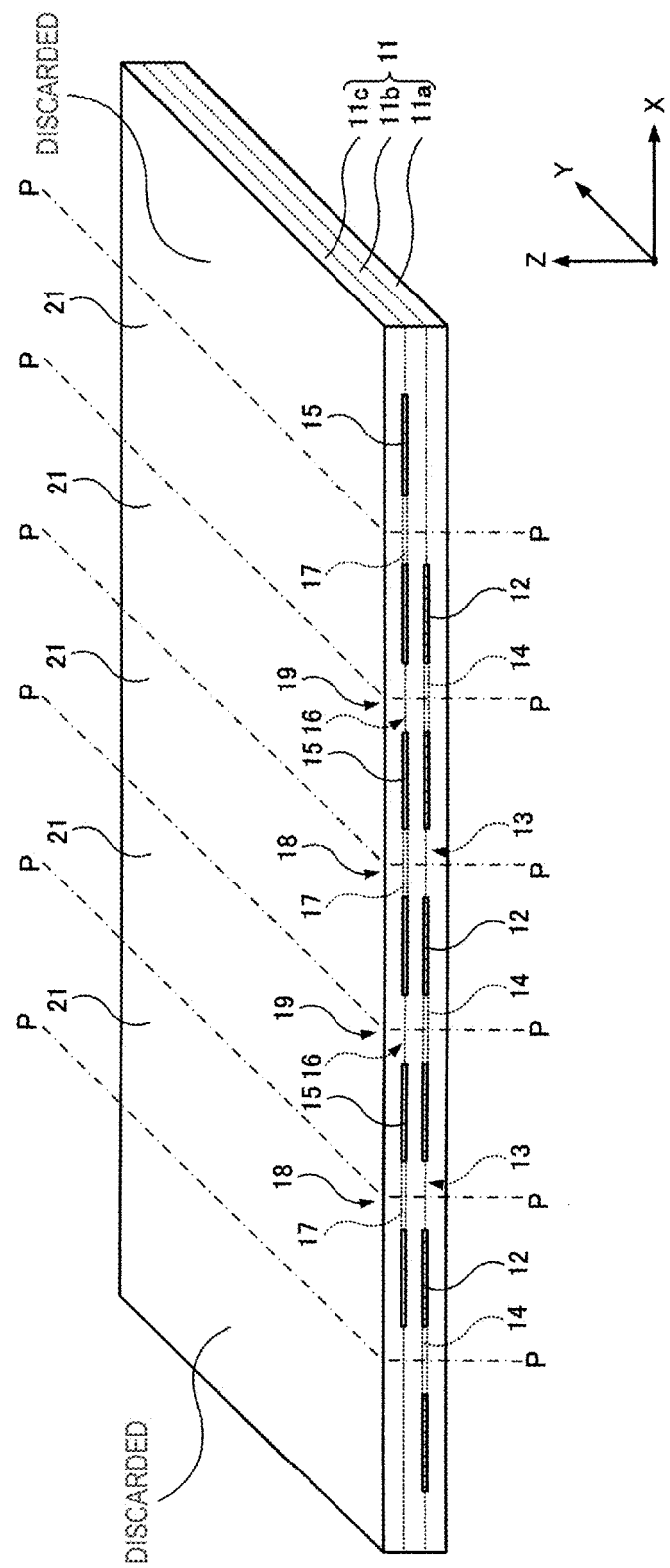
FIG. 2 is a perspective view showing a step subsequent to the step in FIG. 1 performed in the manufacturing method for the multilayer electronic component 100.

Subsequently, the mother green sheets 11a', 11b', and 11c' stacked and integrated with each other are fired to make a first-stage ceramic multilayer body 11 of the first embodiment shown in FIG. 2. The first-stage ceramic multilayer body 11 includes first-stage ceramic layers 11a, 11b, and 11c arranged side by side in the Z direction. In the first-stage ceramic multilayer body 11, in the Z direction, each first gap 13 and the corresponding second cutout 17 overlap each other in a first region 18, while each second gap 16 and the corresponding first cutout 14 overlap each other in a second region 19.

In the first-stage ceramic multilayer body 11, the first-stage first inner electrodes 12 are disposed between the first-stage ceramic layers 11a and 11b, while the first-stage second inner electrodes 15 are disposed between the first-stage ceramic layers 11b and 11c.

The first-stage ceramic multilayer body 11 includes multiple second-stage ceramic multilayer bodies 21, which will be discussed later. The multiple second-stage ceramic multilayer bodies 21 are arranged side by side in the X direction. In FIG. 2, each boundary line between two adjacent second-stage ceramic multilayer bodies 21 is indicated by the long dashed dotted line P. Both end portions of the first-stage ceramic multilayer body 11 in the X direction are portions each adjacent to a second-stage ceramic multilayer body 21 in the X direction. Both end portions of the first-stage ceramic multilayer body 11 in the X direction each include only one of the first-stage first inner electrode 12 and the first-stage second inner electrode 15 and are thus discarded after the first-stage ceramic multilayer body 11 is cut into the second-stage ceramic multilayer bodies 21. In FIG. 2, the boundary line between the end portion of the first-stage ceramic multilayer body 11 on the positive side in the X direction and its adjacent second-stage ceramic multilayer body 21 and that between the end portion of the first-stage ceramic multilayer body 11 on the negative side in the X direction and its adjacent second-stage ceramic multilayer body 21 are also indicated by the long dashed dotted lines P.

Figure 3:
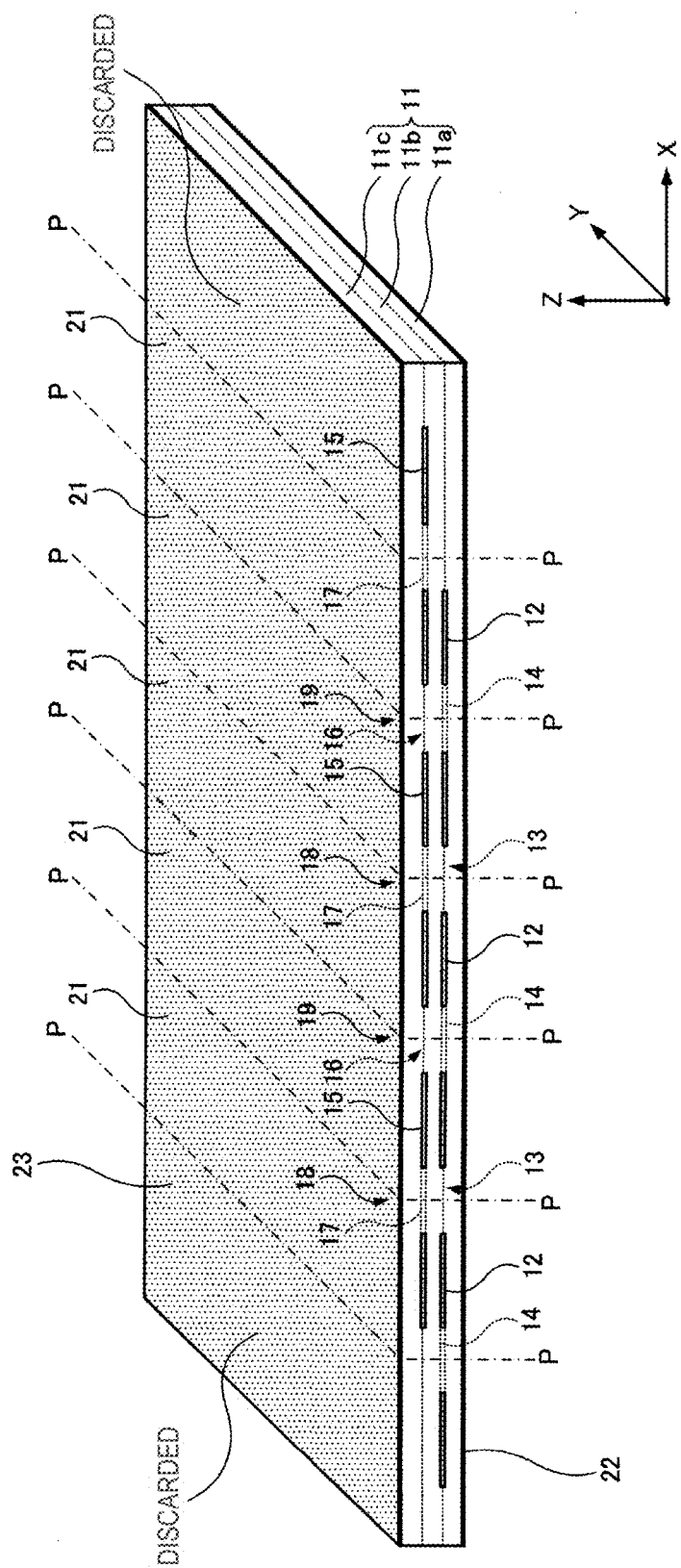
FIG. 3 is a perspective view showing a step subsequent to the step in FIG. 2 performed in the manufacturing method for the multilayer electronic component 100.

Then, as shown in FIG. 3, a bottom-surface electrode 22 is formed on the bottom main surface of the first-stage ceramic multilayer body 11 by sputtering, for example, while a top-surface electrode 23 is formed on the top main surface of the first-stage ceramic multilayer body 11 by sputtering, for example. The bottom-surface electrode 22 and the top-surface electrode 23 each form part of the first outer electrode 4 or the second outer electrode 5 in the completed multilayer electronic component 100.

Figure 4:
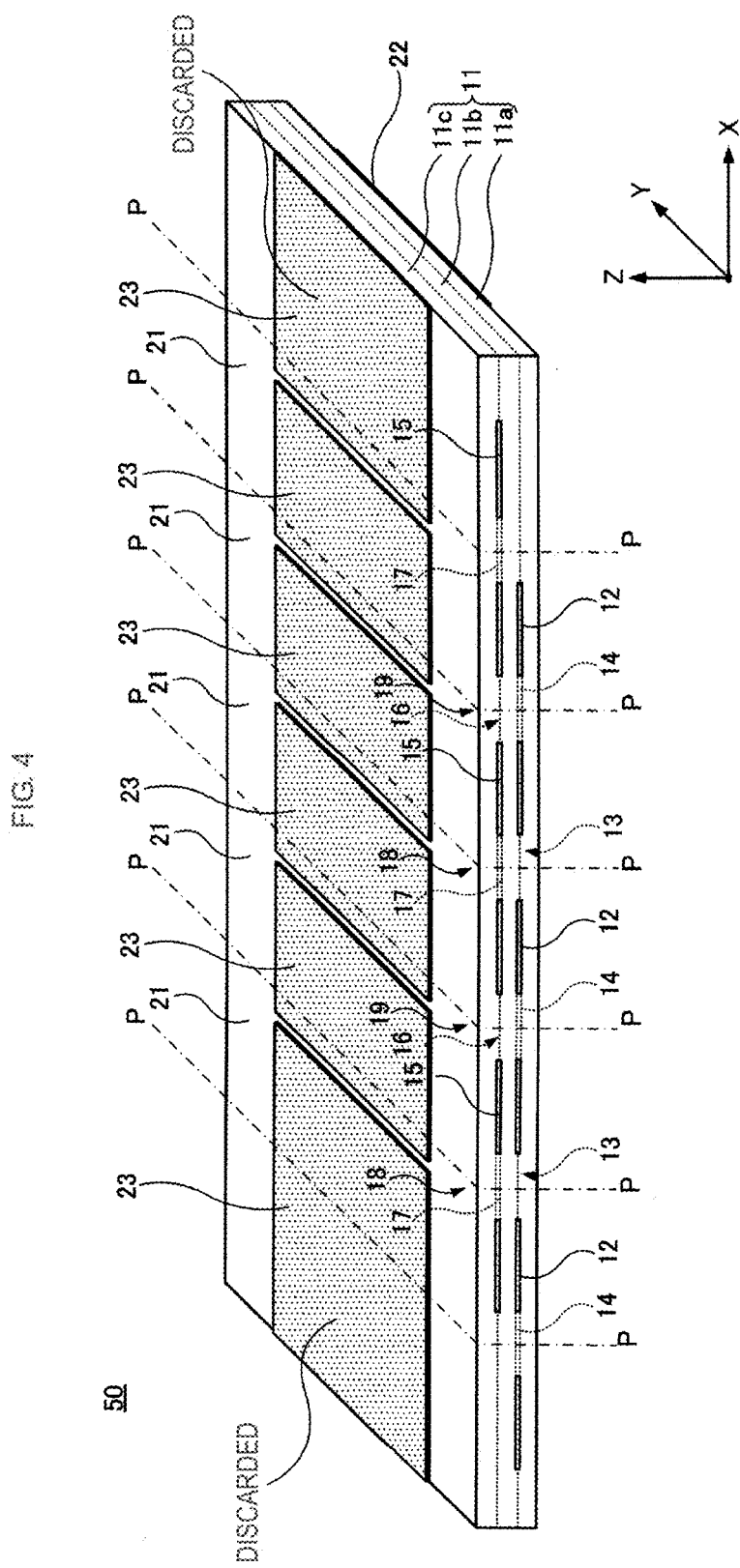
FIG. 4 is a perspective view showing a step subsequent to the step in FIG. 3 performed in the manufacturing method for the multilayer electronic component 100.

Then, as shown in FIG. 4, the bottom-surface electrode 22 and the top-surface electrode 23 are processed into a desired shape by etching.

After the above-described steps, a first-stage ceramic collective board 50 in this embodiment has been completed. The first-stage ceramic collective board 50 includes multiple second-stage ceramic multiplayer bodies 21 arranged side by side in the X direction, which will be discussed later.

Figure 5:
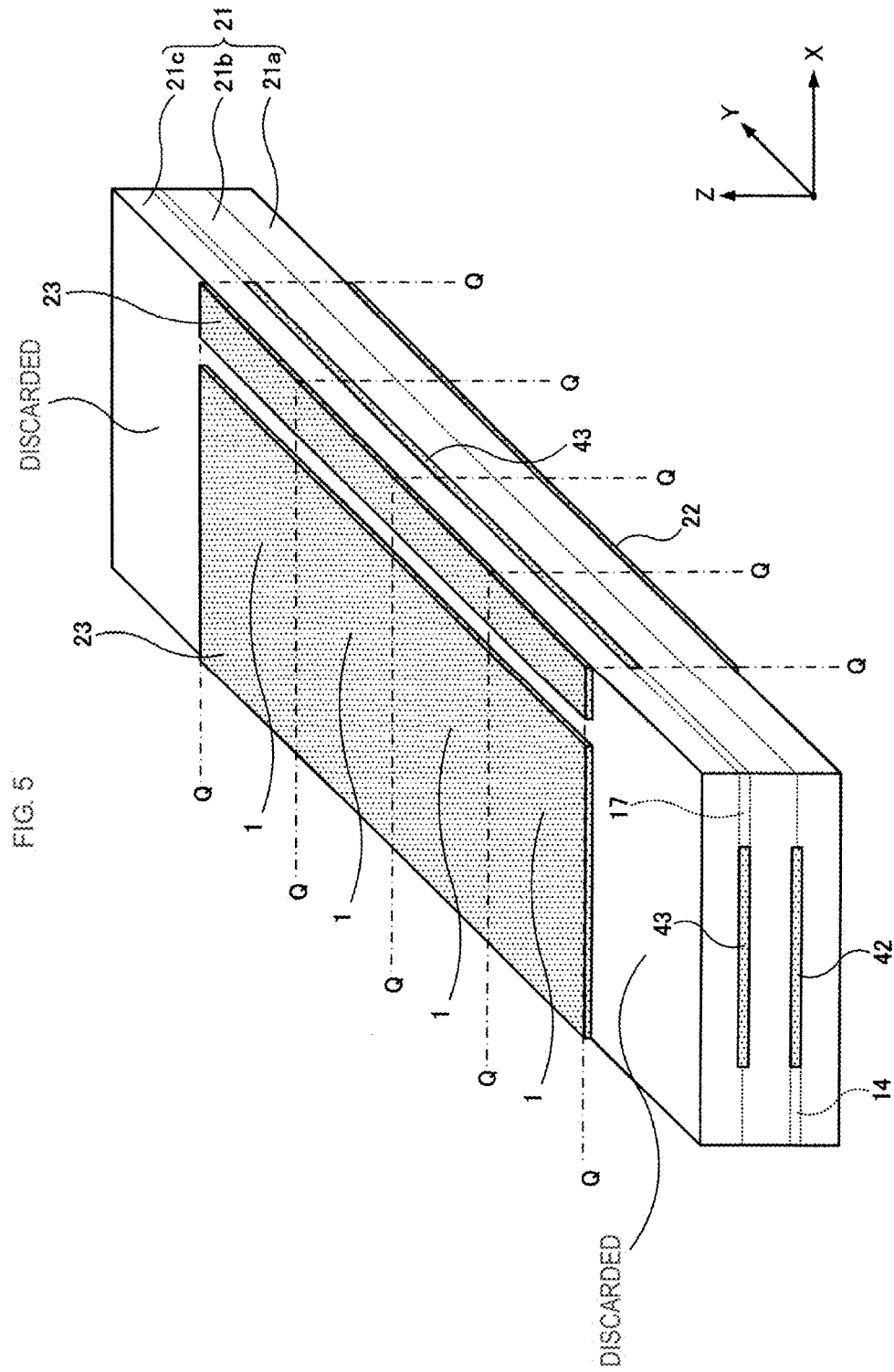
FIG. 5 is a perspective view showing a step subsequent to the step in FIG. 4 performed in the manufacturing method for the multilayer electronic component 100.

Then, the first-stage ceramic collective board 50 is cut along the long dashed dotted lines P, thereby resulting in the multiple second-stage ceramic multilayer bodies 21, one of which is shown in FIG. 5. The second-stage ceramic multilayer body 21 has second-stage ceramic layers 21a, 21b, and 21c.

When cutting the first-stage ceramic collective board 50, extra care should be taken not to cause misalignment between the first-stage first inner electrodes 12 and the first-stage second inner electrodes 15 stacked on each other in the X direction. An explanation will be given regarding how to set cutting lines by using FIG. 10(A) of a first example, FIG. 11(A) of a second example, and FIG. 15 of a third example. Reference is preferably made mainly to FIG. 15 and to FIGS. 10(A) and 11(A) if necessary.

The setting of cutting lines will be discussed more specifically. Seeing through the first-stage ceramic collective board 50 in the Z direction, the region where all the first gaps 13 and second cutouts 17 overlap each other in the Z direction through the first-stage ceramic layers 11a through 11c is set to be a first region 18. Then, seeing through the first region 18 in the Z direction, the side extending in the Y direction and positioned on the positive side in the X direction is set to be a first-region positive side 18A, while the side extending in the Y direction and positioned on the negative side in the X direction is set to be a first-region negative side 18B. An imaginary line positioned at an equal distance from the first-region positive side 18A and from the first-region negative side 18B and extending in the Y direction is set to be a first cutting line 51. The first-region positive side 18A coincides with one of the positive sides 13A of the first gaps 13 and the positive sides 17A of the second cutouts 17 which is positioned on the most negative side in the X direction, as viewed from the Z direction. The first-region negative side 18B coincides with one of the negative sides 13B of the first gaps 13 and the negative sides 17B of the second cutouts 17 which is positioned on the most positive side in the X direction, as viewed from the Z direction.

Seeing through the first-stage ceramic collective board 50 in the Z direction, the region where all the second gaps 16 and first cutouts 14 overlap each other in the Z direction through the first-stage ceramic layers 11a through 11c is set to be a second region 19. Then, seeing through the second region 19 in the Z direction, the side extending in the Y direction and positioned on the positive side in the X direction is set to be a second-region positive side 19A, while the side extending in the Y direction and positioned on the negative side in the X direction is set to be a second-region negative side 19B. An imaginary line positioned at an equal distance from the second-region positive side 19A and from the second-region negative side 19B and extending in the Y direction is set to be a second cutting line 52. The second-region positive side 19A coincides with one of the positive sides 16A of the second gaps 16 and the positive sides 14A of the first cutouts 14 which is positioned on the most negative side in the X direction, as viewed from the Z direction. The second-region negative side 19B coincides with one of the negative sides 16B of the second gaps 16 and the negative sides 14B of the first cutouts 14 which is positioned on the most positive side in the X direction, as viewed from the Z direction. The first-stage ceramic collective board 50 is then cut along the first cutting lines 51 and the second cutting lines 52 in the Y direction. Details of the cutting of the first-stage ceramic collective board 50 will be discussed later in first and second examples and first and second comparative examples.

The first-region positive side 18A, the first-region negative side 18B, the second-region positive side 19A, and the second-region negative side 19B can be determined easily by applying light to the bottom main surface or the top main surface of the first-stage ceramic collective board 50 and seeing the first-stage ceramic collective board 50 from above in the Z direction. In the first-stage ceramic collective board 50, the first-stage ceramic multilayer body 11 is constituted by the very thin first-stage ceramic layers 11a through 11c, and also, in the Z direction, the first gap 13 and the second cutout 17 overlap each other and the second gap 16 and the first cutout 16 overlap each other. The state of the inside of the first-stage ceramic multilayer body 11 can be recognized easily by applying light from the outside without using a special device, such as an X-ray device.

In the second-stage ceramic multilayer body 21, a second-stage first inner electrode 42 is disposed between the second-stage ceramic layers 21a and 21b, while a second-stage second inner electrode 43 is disposed between the second-stage ceramic layers 21b and 21c. The second-stage first inner electrode 42 is one of the portions obtained by cutting the first-stage first inner electrode 12. The second-stage second inner electrode 43 is one of the portions obtained by cutting the first-stage second inner electrode 15.

Figure 6:
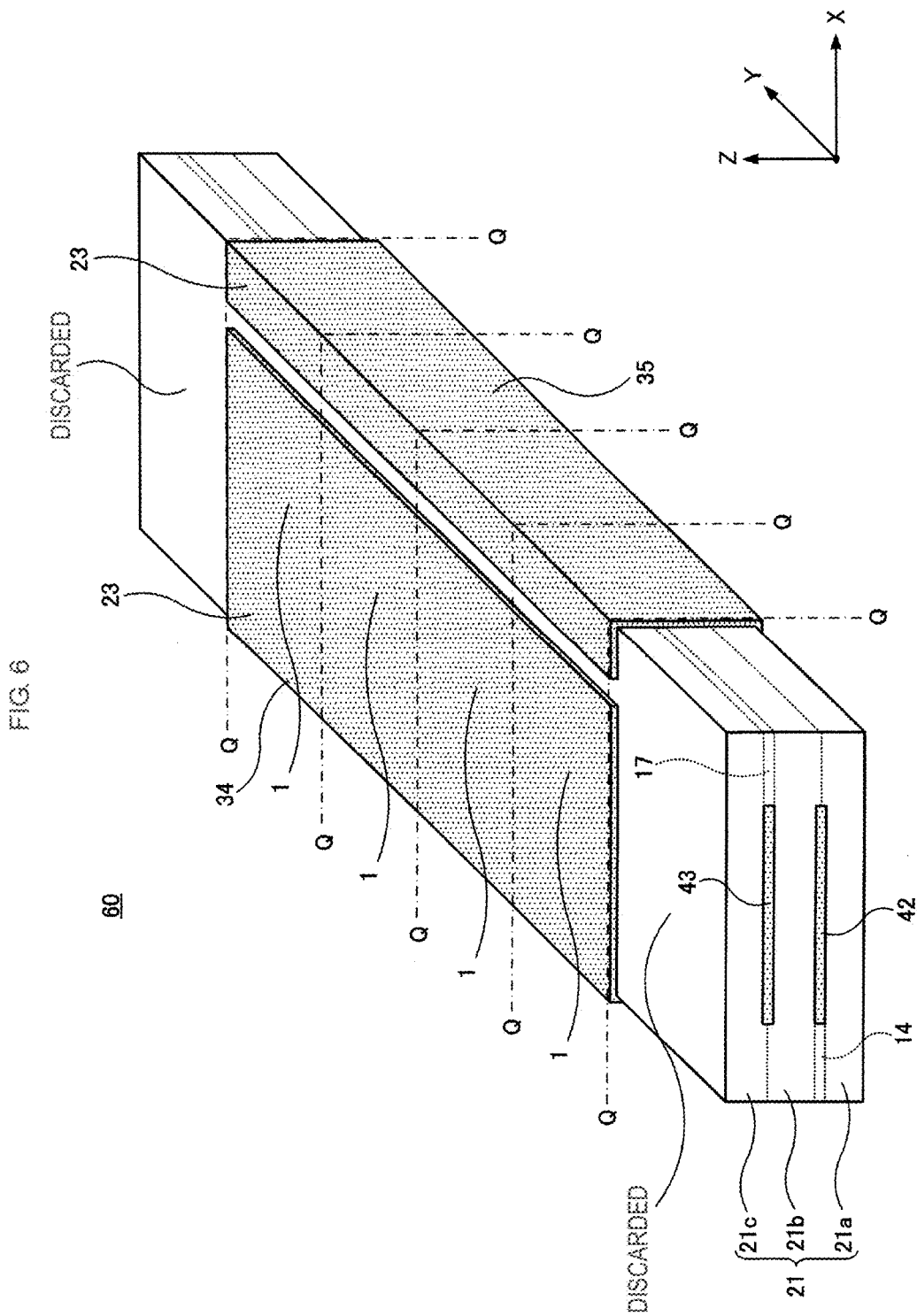
FIG. 6 is a perspective view showing a step subsequent to the step in FIG. 5 performed in the manufacturing method for the multilayer electronic component 100.

The second-stage ceramic multilayer body 21 includes multiple ceramic multilayer bodies 1. The multiple ceramic multilayer bodies 1 are arranged side by side in the Y direction. In FIG. 6, each boundary line between two adjacent ceramic multilayer bodies 1 is indicated by the long dashed dotted line Q. Both end portions of the second-stage ceramic multilayer body 21 in the Y direction are portions each adjacent to a ceramic multilayer body 1 in the Y direction. Both end portions of the second-stage ceramic multilayer body 21 in the Y direction each include the first cutout 14 and the second cutout 17 and are thus discarded after the second-stage ceramic multilayer body 21 is cut into the ceramic multilayer bodies 1. In FIG. 6, the boundary line between the end portion of the second-stage ceramic multilayer body 21 on the positive side in the Y direction and its adjacent ceramic multilayer body 1 and that between the end portion of the second-stage ceramic multilayer body 21 on the negative side in the Y direction and its adjacent ceramic multilayer body 1 are also indicated by the long dashed dotted lines Q.

Subsequently, as shown in FIG. 6, a second-stage first outer electrode 34 and a second-stage second outer electrode 35 are formed on the divided surfaces of the second-stage ceramic multilayer body 21 by sputtering, for example. The second-stage first outer electrode 34 and the second-stage second outer electrode 35 are each integrated with the bottom-surface electrode 22 remaining on the bottom main surface of the second-stage ceramic multilayer body 21 and the top-surface electrode 23 remaining on the top main surface of the second-stage ceramic multilayer body 21.

Then, poling treatment required for the second-stage ceramic multilayer body 21 is performed by applying a predetermined voltage to between the second-stage first outer electrode 34 and the second-stage second outer electrode 35. Poling treatment is performed so that the polarization direction of the second-stage ceramic layers 21a and 21c becomes opposite that of the second-stage ceramic layer 21b in the thickness direction.

After the above-described steps, a second-stage ceramic collective board 60 of this embodiment has been completed.

Subsequently, the second-stage ceramic collective board 60 is cut along the long dashed dotted lines Q, thereby resulting in multiple multilayer electronic components 100, one of which is shown in FIG. 7. In the multilayer electronic component 100, the first inner electrode 2 is one of the portions obtained by cutting the second-stage first inner electrode 42, while the second inner electrode 3 is one of the portions obtained by cutting the second-stage second inner electrode 43. In the multilayer electronic component 100, the first outer electrode 4 is one of the portions obtained by cutting the second-stage first outer electrode 34, while the second outer electrode 5 is one of the portions obtained by cutting the second-stage second outer electrode 35. As a result, the multilayer electronic component 100 according to the first embodiment has been completed.

As stated above, when cutting the first-stage ceramic collective board 50, extra care is taken so as not to cause misalignment between the first-stage first inner electrodes 12 and the first-stage second inner electrodes 15 stacked on each other in the X direction. An explanation will be given regarding how to cut the first-stage ceramic collective board 50.

As shown in FIG. 9, in the first-stage ceramic collective board 50, the first-stage first inner electrodes 12 and the first-stage second inner electrodes 15 are disposed so that each first gap 13 and the corresponding second cutout 17 overlap each other in the first region 18 in the Z direction and each second gap 16 and the corresponding first cutout 14 overlap each other in the second region 19 in the Z direction. For enhancing the visibility, in FIG. 9, the first cutouts 14 and the second cutouts 17 only at the near side of the drawing are designated by reference numerals.

Ideally, it is desirable that the first-stage first inner electrodes 12 and the first-stage second inner electrodes 15 be disposed without misalignment therebetween in the X direction.

The case in which the first-stage first inner electrodes 12 and the first-stage second inner electrodes 15 are positioned without misalignment therebetween in the X direction is shown in FIG. 10(A) as a first example. In FIG. 10(A), the left-right direction is the X direction, and the top-bottom direction is the Z direction. In the first example, the multilayer electronic component 100 shown in FIG. 10(B) is made, as described below.

In the first example, as viewed in the Z direction, in the first region 18, the positive side 13A of the first gap 13 and the positive side 17A of the second cutout 17 overlap each other, which corresponds to the first-region positive side 18A, while the negative side 13B of the first gap 13 and the negative side 17B of the second cutout 17 overlap each other, which corresponds to the first-region negative side 18B. An imaginary line positioned between the first-region positive side 18A (positive side 13A and positive side 17A) and the first-region negative side 18B (negative side 13B and negative side 17B) at an equal distance from the first-region positive side 18A and from the first-region negative side 18B is set to be a first cutting line 51. In FIG. 10(A), although the first cutting line 51 is shown in the Z direction for easy visibility, it actually extends in the Y direction (direction perpendicular to the plane of the drawing in FIG. 10(A)).

In the first example, as viewed in the Z direction, in the second region 19, the positive side 16A of the second gap 16 and the positive side 14A of the first cutout 14 overlap each other, which corresponds to the second-region positive side 19A, while the negative side 16B of the second gap 16 and the negative side 14B of the first cutout 14 overlap each other, which corresponds to the second-region negative side 19B. An imaginary line positioned between the second-region positive side 19A (positive side 16A and positive side 14A) and the second-region negative side 19B (negative side 16B and negative side 14B) at an equal distance from the second-region positive side 19A and from the second-region negative side 19B is set to be a second cutting line 52. In FIG. 10(A), although the second cutting line 52 is shown in the Z direction for easy visibility, it actually extends in the Y direction (direction perpendicular to the plane of the drawing in FIG. 10(A)).

In the first example, by cutting the first-stage ceramic collective board 50 along the first cutting lines 51 and the second cutting lines 52, the second-stage ceramic collective board 60 is made. Then, by cutting the second-stage ceramic collective board 60, the multilayer electronic component 100 is made. The multilayer electronic component 100 made in the first example is shown in FIG. 10(B).

In the multilayer electronic component 100 made in the first example, the ceramic multilayer body 1 has the design length J. The first inner electrode 2 has the design length K and the distance D1 has the design length L. The second electrode 3 has the design length M and the distance D2 has the design length N.

The case in which misalignment occurs between the first-stage inner electrode 12 and the first-stage second inner electrode 15 in the X direction is shown in FIG. 11(A) as a second example. More specifically, in the second example, it is assumed that the first-stage first inner electrode 12 is displaced toward the positive side in the X direction, while the first-stage second inner electrode 15 is displaced toward the negative side in the X direction and that the amount of misalignment between the first-stage first inner electrode 12 and the first-stage second inner electrode 15 is a length α. In the second example, two types of multilayer electronic components, multilayer electronic components 100A and 100B shown in FIG. 11(B), are made, as described below.

In the second example, in the first region 18, the positive side 13A of the first gap 13 and the positive side 17A of the second cutout 17 are compared with each other as viewed from the Z direction, and the positive side 17A of the second cutout 17 positioned on the more negative side in the X direction is set to be the first-region positive side 18A. In the first region 18, the negative side 13B of the first gap 13 and the negative side 17B of the second cutout 17 are compared with each other as viewed from the Z direction, and the negative side 13B of the first gap 13 positioned on the more positive side in the X direction is set to be the first-region negative side 18B. Then, as viewed from the Z direction, an imaginary line positioned at an equal distance from the positive side 17A of the second cutout 17, which is the first-region positive side 18A, and from the negative side 13B of the first gap 13, which is the first-region negative side 18B, is set to be the first cutting line 51.

In the second example, in the second region 19, the positive side 16A of the second gap 16 and the positive side 14A of the first cutout 14 are compared with each other as viewed from the Z direction, and the positive side 16A of the second gap 16 positioned on the more negative side in the X direction is set to be the second-region positive side 19A. In the second region 19, the negative side 16B of the second gap 16 and the negative side 14B of the first cutout 14 are compared with each other as viewed from the Z direction, and the negative side 14B of the first cutout 14 positioned on the more positive side in the X direction is set to be the second-region negative side 19B. Then, as viewed from the Z direction, an imaginary line positioned at an equal distance from the positive side 16A of the second gap 16, which is the second-region positive side 19A, and from the negative side 14B of the first cutout 14, which is the second-region negative side 19B, is set to be the second cutting line 52.

In the second example, by cutting the first-stage ceramic collective board 50 along the first cutting lines 51 and the second cutting lines 52, the second-stage ceramic collective board 60 is made. Then, the second-stage ceramic collective board 60 is cut into the individual ceramic multilayer bodies 1. As a result, the multilayer electronic components 100A and 100B are made. The multilayer electronic components 100A and 100B made in the second example are shown in FIG. 11(B).

In both of the multilayer electronic components 100A and 100B made in the second example, the ceramic multilayer body 1 has the design length J.

In the multilayer electronic component 100A, the first inner electrode 2 is longer than the design length K and has a length $(K+\frac{1}{2}\alpha)$, while the second inner electrode 3 is longer than the design length M and has a length $(M+\frac{1}{2}\alpha)$. In the multilayer electronic component 100A, the distance D1 between the edge of the first inner electrode 2 and the end surface 1E2 is shorter than the design length L and has a length $(L-\frac{1}{2}\alpha)$, while the distance D2 between the edge of the second inner electrode 3 and the end surface 1E1 is shorter than the design length N and has a length $(N-\frac{1}{2}\alpha)$.

In the multilayer electronic component 100B, the first inner electrode 2 is shorter than the design length K and has a length $(K-\frac{1}{2}\alpha)$, while the second inner electrode 3 is shorter than the design length M and has a length $(M-\frac{1}{2}\alpha)$. In the multilayer electronic component 100B, the distance D1 between the edge of the first inner electrode 2 and the end surface 1E2 is longer than the design length L and has a length $(L+\frac{1}{2}\alpha)$, while the distance D2 between the edge of the second inner electrode 3 and the end surface 1E1 is longer than the design length N and has a length $(N+\frac{1}{2}\alpha)$.

That is, in the multilayer electronic components 100A and 100B, a misalignment length α between the first-stage first inner electrode 12 and the first-stage second inner electrode 15 in the X direction occurred during the making of the first-stage ceramic collective board 50 is adjusted in a well-balanced manner by the length K of the first inner electrode 2, the length M of the second inner electrode 3, the length L of the distance D1 between the edge of the first inner electrode 2 and the end surface 1E2, and the length N of the distance D2 between the edge of the second inner electrode 3 and the end surface 1E1. In the multilayer electronic components 100A and 100B, the amounts of misalignment of the lengths K, L, M, and N deviating from the respective design lengths are contained within +½α or −½α. Usually, the misalignment length α in the X direction that may occur during the manufacturing steps is extremely small, and the above-described amounts of misalignment deviating from the design lengths K, L, M, and N are totally acceptable. Moreover, in both of the multilayer electronic components 100A and 100B, the ceramic multilayer body 1 has the design length J.

The case in which the first-stage first inner electrode 12 and the first-stage second inner electrode 15 are cut by an approach of the related art is shown in FIG. 12(A) as a first comparative example. In the first comparative example, two types of multilayer electronic components, multilayer electronic components 500 and 600 shown in FIG. 12(B), are made, as described below.

In the first comparative example, as well as in the second example, misalignment occurs between the first-stage first inner electrode 12 and the first-stage second inner electrode 15 in the X direction. More specifically, in the first comparative example, it is assumed that the first-stage first inner electrode 12 is displaced toward the positive side in the X direction, while the first-stage second inner electrode 15 is displaced toward the negative side in the X direction and that the amount of misalignment between the first-stage first inner electrode 12 and the first-stage second inner electrode 15 is a length α.

In the first comparative example, no first cutout 14 is formed in the first-stage first inner electrode 12, while no second cutout 17 is formed in the first-stage second inner electrode 15.

In the first comparative example, as viewed in the Z direction, an imaginary line positioned between the positive side 13A and the negative side 13B of the first gap 13 at an equal distance from the positive side 13A and from the negative side 13B is set to be a first cutting line 51. The first cutting line 51 is difficult to determine unless a special device, such as an X-ray device, is used.

In the first comparative example, as viewed in the Z direction, an imaginary line positioned between the positive side 16A and the negative side 16B of the second gap 16 at an equal distance from the positive side 16A and from the negative side 13B is set to be a second cutting line 52. The second cutting line 52 is difficult to determine unless a special device, such as an X-ray device, is used.

In the first comparative example, by cutting the first-stage ceramic collective board 50 along the first cutting lines 51 and the second cutting lines 52, the second-stage ceramic collective board 60 is made. Then, the second-stage ceramic collective board 60 is cut into the individual ceramic multilayer bodies 1 so as to make multilayer electronic components. In the first comparative example, two types of multilayer electronic components, the multilayer electronic components 500 and 600 whose ceramic multilayer bodies 1 have different lengths, are made, as shown in FIG. 12(B).

As shown in FIG. 12(B), neither of the ceramic multilayer body 1 of the multilayer electronic component 500 nor that of the multilayer electronic component 600 has the design length J. More specifically, the ceramic multilayer body 1 of the multilayer electronic component 500 has a length (J+α), while the ceramic multilayer body 1 of the multilayer electronic component 600 has a length (J−α).

In the multilayer electronic component 500, the first inner electrode 2 does not have the design length K and instead has a length (K+α), while the second inner electrode 3 does not have the design length M and instead has a length (M+α). In the multilayer electronic component 500, however, the distance D1 has the design length L, while the distance D2 has the design length N.

In the multilayer electronic component 600, the first inner electrode 2 does not have the design length K and instead has a length (K−α), while the second inner electrode 3 does not have the design length M and instead has a length (M−α). In the multilayer electronic component 600, however, the distance D1 has the design length L, while the distance D2 has the design length N.

In this manner, according to the approach of the first comparative example, the length J of the ceramic multilayer body 1, the length K of the first inner electrode 2, and the length M of the second inner electrode 3 of the multilayer electronic component 500 and those of the multilayer electronic component 600 significantly different from each other. More specifically, the length of the ceramic multilayer body 1 of the multilayer electronic component 500 is (J+α), while that of the multilayer electronic component 600 is (J−α); the length of the first inner electrode 2 of the multilayer electronic component 500 is (K+α), while that of the multilayer electronic component 600 is (K−α); and the length of the second inner electrode 3 of the multilayer electronic component 500 is (M+α), while that of the multilayer electronic component 600 is (M−α). According to the approach of the first comparative example, the characteristics of the multilayer electronic component 500 and those of the multilayer electronic component 600 become significantly different from each other, and thus, they are not suitable to be put to practical use. Additionally, the length of the ceramic multilayer body 1 of the multilayer electronic component 500 and that of the multilayer electronic component 600 are significantly different from each other, and thus, they are not suitable to be put to practical use.

The case in which the first-stage first inner electrode 12 and the first-stage second inner electrode 15 are cut by another approach of the related art is shown in FIG. 13(A) as a second comparative example. In the second comparative example, two types of multilayer electronic components, multilayer electronic components 700 and 800 shown in FIG. 13(B), are made, as described below.

In the second comparative example, as well as in the second example and the first comparative example, misalignment occurs between the first-stage first inner electrode 12 and the first-stage second inner electrode 15 in the X direction. More specifically, in the second comparative example, it is assumed that the first-stage first inner electrode 12 is displaced toward the positive side in the X direction, while the first-stage second inner electrode 15 is displaced toward the negative side in the X direction and that the amount of misalignment between the first-stage first inner electrode 12 and the first-stage second inner electrode 15 is a length α.

In the second comparative example, as well as in the first comparative example, no first cutout 14 is formed in the first-stage first inner electrode 12, while no second cutout 17 is formed in the first-stage second inner electrode 15.

In the second comparative example, as viewed in the Z direction, an imaginary line positioned between the positive side 13A and the negative side 13B of the first gap 13 at an equal distance from the positive side 13A and from the negative side 13B is set to be a first cutting line 51. The first cutting line 51 is difficult to determine unless a special device, such as an X-ray device, is used.

In the second comparative example, as viewed in the Z direction, an imaginary line positioned between two adjacent first cutting lines 51 at an equal distance from one first cutting line 51 and from the other first cutting line 51 is set to be a second cutting line 52. In the second comparative example, the distance between each first cutting line 51 and the second cutting line 52 has the length J.

In the second comparative example, by cutting the first-stage ceramic collective board 50 along the first cutting lines 51 and the second cutting lines 52, the second-stage ceramic collective board 60 is made. Then, the second-stage ceramic collective board 60 is cut into the individual ceramic multilayer bodies 1 so as to make multilayer electronic components. In the second comparative example, two types of multilayer electronic components, the multilayer electronic components 700 and 800, are made, as shown in FIG. 13(B).

In both of the multilayer electronic components 700 and 800 made in the second comparative example, the ceramic multilayer body 1 has the design length J. Additionally, the first inner electrode 2 has the design length K, while the distance D1 has the design length L.

In the multilayer electronic component 700 made in the second comparative example, however, the second inner electrode 3 does not have the design length M and instead has a length (M+α), while the distance D2 does not have the design length N and instead has a length (N−α).

In the multilayer electronic component 800 made in the second comparative example, the second inner electrode 3 does not have the design length M and instead has a length (M−α), while the distance D2 does not have the design length N and instead has a length (N+α).

In this manner, according to the approach of the second comparative example, the length M of the second inner electrode 3 and the length N of the second distance D2 of the multilayer electronic component 700 and those of the multilayer electronic component 800 significantly different from each other. More specifically, the length of the second inner electrode 3 of the multilayer electronic component 700 is (M+α), while that of the multilayer electronic component 800 is (M−α); and the length of the second distance D2 of the multilayer electronic component 700 is (N+α), while that of the multilayer electronic component 800 is (N−α). According to the approach of the second comparative example, the characteristics of the multilayer electronic component 700 and those of the multilayer electronic component 800 become significantly different from each other, and thus, they are not suitable to be put to practical use. In particular, in the multilayer electronic component 700, the length of the distance D2 is (N−α) so that the edge of the second inner electrode 3 excessively approaches the end surface 1E1 of the ceramic multilayer body 1, which may cause short-circuiting between the second inner electrode 3 and the first outer electrode 4. Hence, the multilayer electronic component 700 is not suitable to be put to practical use.

As described above, in the first example of the first embodiment, misalignment does not occur between the first-stage first inner electrode 12 and the first-stage second inner electrode 15 in the X direction. In the second example of the first embodiment, the first-stage first inner electrode 12 is displaced toward the positive side in the X direction, while the first-stage second inner electrode 15 is displaced toward the negative side in the X direction, which produces the misalignment length α between the first-stage first inner electrode 12 and the first-stage second inner electrode 15. Nevertheless, not to mention the first example, even in the second example in which misalignment has occurred, the resulting multilayer electronic component 100 can safely be put to practical use. In contrast, in the first and second comparative examples in which the first-stage first inner electrode 12 and the first-stage second inner electrode 15 are cut by the approaches of the related art, the resulting multilayer electronic components 500, 600, 700, and 800 have become defective, or if not, the characteristics of the multilayer electronic component 500 have become different from those of the multilayer electronic component 600 and the characteristics of the multilayer electronic component 700 have become different from those of the multilayer electronic component 800. It is thus found that the multilayer electronic components 500, 600, 700, and 800 are not suitable to be put to practical use. The effectiveness of the present disclosure has thus been validated.

Second Embodiment

A multilayer electronic component 200 made in a second embodiment is shown in FIG. 14. FIG. 14 is a perspective view of the multilayer electronic component 200.

The multilayer electronic component 200 according to the second embodiment is an electronic component in which part of the configuration of the multilayer electronic component 100 of the first embodiment is modified. More specifically, in the multilayer electronic component 200, the ceramic multilayer body 1 is constituted by five ceramic layers 1a through 1e. In the ceramic multilayer body 1, a first-layer first inner electrode 2 counted from the bottom is disposed between the ceramic layers 1a and 1b; a second-layer second inner electrode 3 counted from the bottom is disposed between the ceramic layers 1b and 1c; a third-layer first inner electrode 2 counted from the bottom is disposed between the ceramic layers 1c and 1d; and a fourth-layer second inner electrode 3 counted from the bottom is disposed between the ceramic layers 1d and 1e. The configurations of the other portions of the multilayer electronic component 200 are the same as the multilayer electronic component 100.

In the multilayer electronic component 200, as shown as a third example in FIG. 15, it is assumed that, although the second-layer first-stage second inner electrode 15 and the third-layer first-stage first inner electrode 12 are disposed at correct positions, the first-layer first-stage first inner electrode 12 is displaced toward the positive side in the X direction, while the fourth-layer first-stage second inner electrode 15 is displaced toward the negative side in the X direction. It is also assumed that the amount of misalignment between the first-layer first-stage first inner electrode 12 and the fourth-layer first-stage second inner electrode 15 is a length α.

In the third example, in the first region 18, among the positive sides 13A of the first gaps 13 and the positive sides 17A of the second cutouts 17, the positive side 17A of the fourth-layer second cutout 17 positioned on the most negative side in the X direction is set to be the first-region positive side 18A. In the first region 18, among the negative sides 13B of the first gaps 13 and the negative sides 17B of the second cutouts 17, the negative side 13B of the first-layer first gap 13 positioned on the most positive side in the X direction is set to be the first-region negative side 18B. Then, as viewed from the Z direction, an imaginary line positioned at an equal distance from the first-region positive side 18A (the positive side 17A of the fourth-layer second cutout 17) and from the first-region negative side 18B (the negative side 13B of the first-layer first gap 13) is set to be the first cutting line 51.

In the third example, in the second region 19, among the positive sides 16A of the second gaps 16 and the positive sides 14A of the first cutouts 14, the positive side 16A of the fourth-layer second gap 16 positioned on the most negative side in the X direction is set to be the second-region positive side 19A. In the second region 19, among the negative sides 16B of the second gaps 16 and the negative sides 14B of the first cutouts 14, the negative side 14B of the first-layer first cutout 14 positioned on the most positive side in the X direction is set to be the second-region negative side 19B. Then, as viewed from the Z direction, an imaginary line positioned at an equal distance from the second-region positive side 19A (the positive side 16A of the fourth-layer second gap 16) and from the second-region negative side 19B (the negative side 14B of the first-layer first cutout 14) is set to be the second cutting line 52.

Figure 16:
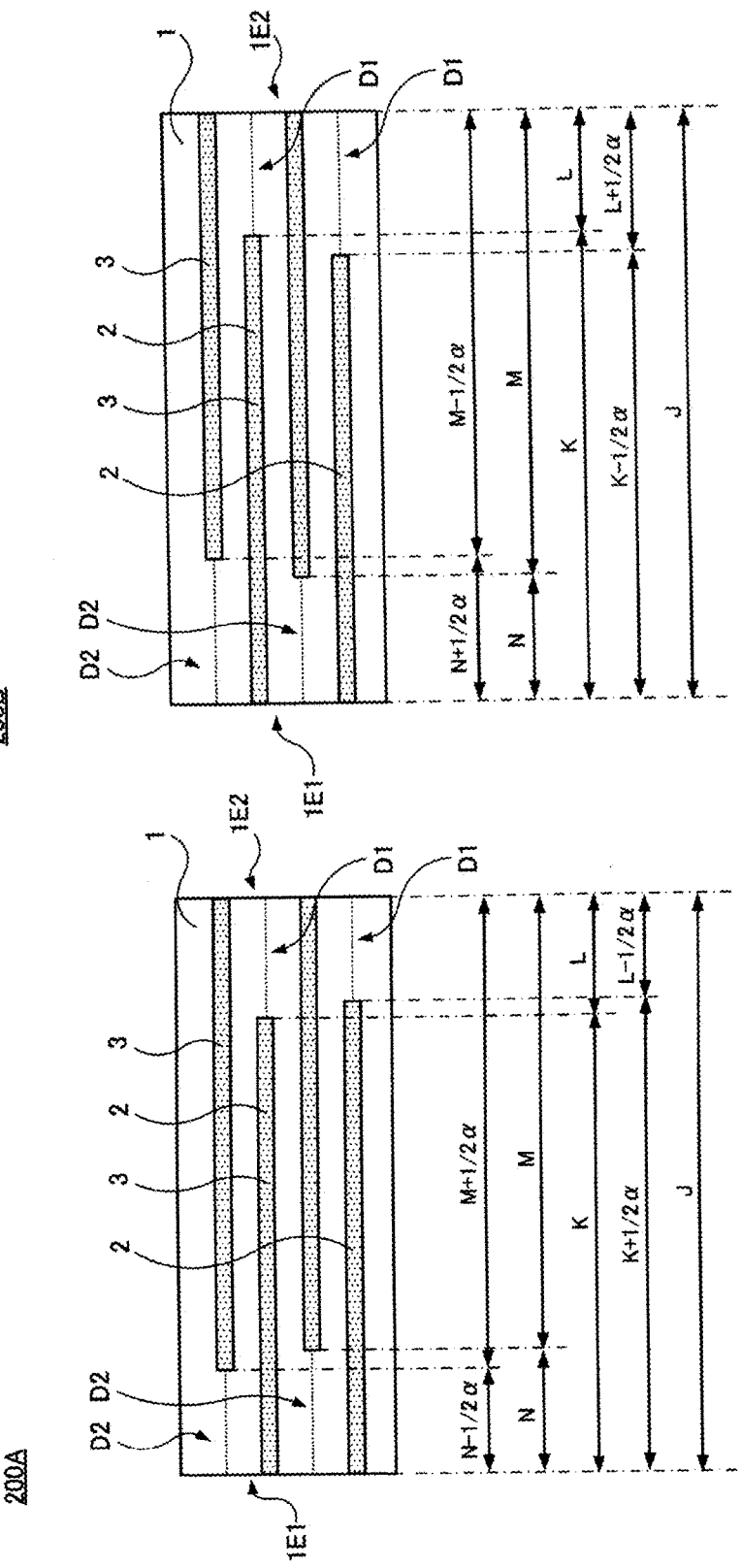
FIG. 16 shows front views of multilayer electronic components 200 in the third example.

In the third example, two types of multilayer electronic components, multilayer electronic components 200A and 200B shown in FIG. 16, are made.

In the multilayer electronic component 200A, the ceramic multilayer body 1 has the design length J, as shown in FIG. 16. The first-layer first inner electrode 2 has a length (K+½α) and the distance D1 of the first-layer first inner electrode 2 has a length (L−½α). The second-layer second inner electrode 3 has the design length M and the distance D2 of the second-layer second inner electrode 3 has the design length N. The third-layer first inner electrode 2 has the design length K and the distance D1 of the third-layer first inner electrode 2 has the design length L. The fourth-layer second inner electrode 3 has a length (M+½α) and the distance D2 of the fourth-layer second inner electrode 3 has a length (N−½α).

In the multilayer electronic component 200A, the length (K+½α) of the first-layer first inner electrode 2 is longer but is not too long, while the length (M+½α) of the fourth-layer second inner electrode 3 is longer but is not too long. The first-layer first inner electrode 2 and the fourth-layer second inner electrode 3 do not present any problem in terms of practical use. In the multilayer electronic component 200A, the distance D1 (L−½α) of the first-layer first inner electrode 2 is shorter but is not too short, while the distance D2 (N−½α) of the fourth-layer second inner electrode 3 is shorter but is not too short. The distance D1 and the distance D2 do not present any problem in terms of practical use. In this manner, the multilayer electronic component 200A of the third example can safely be put to practical use.

In the multilayer electronic component 200B, the ceramic multilayer body 1 has the design length J, as shown in FIG. 16. The first-layer first inner electrode 2 has a length (K−½α) and the distance D1 of the first-layer first inner electrode 2 has a length (L+½α). The second-layer second inner electrode 3 has the design length M and the distance D2 of the second-layer second inner electrode 3 has the design length N. The third-layer first inner electrode 2 has the design length K and the distance D1 of the third-layer first inner electrode 2 has the design length L. The fourth-layer second inner electrode 3 has a length (M−½α) and the distance D2 of the fourth-layer second inner electrode 3 has a length (N+½α).

In the multilayer electronic component 200B, the length (K−½α) of the first-layer first inner electrode 2 is shorter but is not too short, while the length (M−½α) of the fourth-layer second inner electrode 3 is shorter but is not too short. The first-layer first inner electrode 2 and the fourth-layer second inner electrode 3 do not present any problem in terms of practical use. In the multilayer electronic component 200B, the distance D1 (L+½α) of the first-layer first inner electrode 2 is longer but is not too long, while the distance D2 (N+½α) of the fourth-layer second inner electrode 3 is longer but is not too long. The distance D1 and the distance D2 do not present any problem in terms of practical use. In this manner, the multilayer electronic component 200B of the third example can safely be put to practical use.

As described above, in the third example, too, in the multilayer electronic components 200A and 200B, a misalignment length α between the first-stage first inner electrode 12 and the first-stage second inner electrode 15 in the X direction occurred during the making of the first-stage ceramic collective board 50 is adjusted in a well-balanced manner by the length K of the first inner electrode 2, the length M of the second inner electrode 3, the length L of the distance D1 between the edge of the first inner electrode 2 and the end surface 1E2, and the length N of the distance D2 between the edge of the second inner electrode 3 and the end surface 1E1.

As is seen from the front views of the multilayer electronic components shown in FIG. 16, in a multilayer electronic component such as the multilayer electronic component 200A, when the length of the shortest distance D1 is equal to that of the shortest distance D2, it can be assumed that the length of the shortest distance D1 is (L−½α) and that of the shortest distance D2 is (N−½α). It can thus be assumed that this multilayer electronic component has been made by the method in the second embodiment. Alternatively, in a multilayer electronic component such as the multilayer electronic component 200B, when the length of the longest distance D1 is equal to that of the longest distance D2, it can be assumed that the length of the longest distance D1 is (L+½α) and that of the longest distance D2 is (N+½α). It can thus be assumed that this multilayer electronic component has been made by the method in the second embodiment. In both the cases, the above-described assumptions can hold true on condition that the multilayer electronic component has two or more first inner electrodes 2 and two or more second inner electrodes 3 and that the design length L of the distance D1 and the design length N of the distance D2 are equal to each other (L=N), that is, the width A of the first gap and the second cutout 17 is equal to the width B of the first cutout 14 and the second gap 16 (a=b) in the first-stage ceramic collective board.

FIG. 16 used for explaining the third example shows the front views of the multilayer electronic component 200 of the third example. Each of the front views coincides with a sectional view cut along a surface of the second-stage ceramic collective board extending in the X direction and the Z direction. Hence, in a sectional surface cut along a surface of the second-stage ceramic collective board extending in the X direction and the Z direction, when the length of the shortest distance between the edge of the second-stage first inner electrode and the outer surface of the second-stage ceramic collective board (second-stage ceramic multilayer body) opposing this second-stage first inner electrode is equal to the length of the shortest distance between the edge of the second-stage second inner electrode and the outer surface of the second-stage ceramic collective board (second-stage ceramic multilayer body) opposing this second-stage second inner electrode, it can be assumed that this second-stage ceramic collective board has been made by the method of the second embodiment. Alternatively, in a sectional surface cut along a surface of the second-stage ceramic collective board extending in the X direction and the Z direction, when the length of the longest distance between the edge of the second-stage first inner electrode and the outer surface of the second-stage ceramic collective board (second-stage ceramic multilayer body) opposing this second-stage first inner electrode is equal to the length of the longest distance between the edge of the second-stage second inner electrode and the outer surface of the second-stage ceramic collective board (second-stage ceramic multilayer body) opposing this second-stage second inner electrode, it can be assumed that this second-stage ceramic collective board has been made by the method of the second embodiment. In both the cases, the above-described assumptions can hold true on condition that the second-stage ceramic collective board has two or more second-stage first inner electrodes and two or more second-stage second inner electrodes and that the width A of the first gap and the second cutout 17 is equal to the width B of the first cutout 14 and the second gap 16 (a=b) in the first-stage ceramic collective board.

The first and second embodiments have been discussed above. The present disclosure is not restricted to the above-described content and various modifications may be made within the spirit and scope of the disclosure.

For example, in the multilayer electronic components 100 and 200, the length of the first inner electrode 2 and that of the second inner electrode 3 are designed to be equal to each other. The width A of the first gap 13 and the second cutout 17 and the width B of the first cutout 14 and the second gap 16 are thus formed to be the same. Nevertheless, the width A and the width B are not necessarily formed to be the same. If it is desired that the length of the first inner electrode 2 and that of the second inner electrode 3 be different from each other, the width A and the width B are made different from each other. In this case, too, the first cutting line 51 and the second cutting line 52 are determined by the same approaches discussed in the above-described embodiments.

In the first-stage ceramic collective board 50, the first cutout 14 is provided on both sides of the first-stage first inner electrode 12 extending in the X direction. However, the first cutout 14 may be provided only on one side of the first-stage first inner electrode 12. Likewise, in the first-stage ceramic collective board 50, the second cutout 17 is provided on both sides of the first-stage second inner electrode 15 extending in the X direction. However, the second cutout 17 may be provided only on one side of the first-stage second inner electrode 15.

Although the multilayer electronic components 100 and 200 are multilayer piezoelectric actuators, any type of multilayer electronic component may be made. That is, the multilayer electronic components 100 and 200 are not limited to multilayer piezoelectric actuators and may be another type of multilayer electronic component, such as a multilayer ceramic capacitor and a multilayer thermistor.

The embodiments disclosed herein are illustrative only and are not intended to be limiting in any way. The scope of the present disclosure is defined by the appended claims rather than the foregoing description, and it should be understood that all the changes conceived from the meaning and scope of the claims and their equivalents are included in the scope of the present disclosure.

The invention claimed is:
1. A first-stage ceramic collective board comprising:
a first-stage ceramic multilayer body, wherein
based on an X direction, a Y direction perpendicular to the X direction, and a Z direction perpendicular to the X direction and the Y direction, each of the X direction, the Y direction, and the Z direction having a positive side and a negative side,
the first-stage ceramic multilayer body includes
a plurality of first-stage ceramic layers that extend in the X direction and the Y direction and that are arranged side by side in the Z direction,
a plurality of first-stage first inner electrodes that are disposed between a pair of first-stage ceramic layers adjacent to each other in the Z direction among the plurality of first-stage ceramic layers and that extend in the X direction and the Y direction and are arranged side by side in the X direction with a first gap interposed therebetween, the first gap having a width A, and
a plurality of first-stage second inner electrodes that are disposed between a pair of first-stage ceramic layers adjacent to each other in the Z direction among the plurality of first-stage ceramic layers and that extend in the X direction and the Y direction and are arranged side by side in the X direction with a second gap interposed therebetween, the second gap having a width B, the pair of first-stage ceramic layers sandwiching the plurality of first-stage second inner electrodes being different from the pair of first-stage ceramic layers sandwiching the plurality of first-stage first inner electrodes,
the first-stage first inner electrodes each include a first cutout on at least one of end portions in the Y direction, the first cutout extending in the X direction and the Y direction and having the width B in the X direction,
the first-stage second inner electrodes each include a second cutout on at least one of end portions in the Y direction, the second cutout extending in the X direction and the Y direction and having the width A in the X direction, and
when the first-stage ceramic multilayer body is seen through in the Z direction, there are provided
a first region where the first gap and the second cutout overlap each other, and
a second region where the second gap and the first cutout overlap each other.
2. The first-stage ceramic collective board according to claim 1, wherein the width A and the width B are equal to each other.
3. The first-stage ceramic collective board according to claim 1, wherein a length of the first-stage first inner electrodes and a length of the first-stage second inner electrodes are equal.
4. The first-stage ceramic collective board according to claim 1, wherein the first-stage first inner electrodes and the first-stage second inner electrodes are made of metal.
5. A second-stage ceramic collective board comprising:
a second-stage ceramic multilayer body, wherein
based on an X direction, a Y direction perpendicular to the X direction, and a Z direction perpendicular to the X direction and the Y direction, each of the X direction, the Y direction, and the Z direction having a positive side and a negative side,
the second-stage ceramic multilayer body includes
a plurality of second-stage ceramic layers that extend in the X direction and the Y direction and that are arranged side by side in the Z direction,
a second-stage first inner electrode that is disposed between a pair of second-stage ceramic layers adjacent to each other in the Z direction among the plurality of second-stage ceramic layers and that extends in the X direction and the Y direction, and a second-stage second inner electrode that is disposed between a pair of second-stage ceramic layers adjacent to each other in the Z direction among the plurality of second-stage ceramic layers and that extends in the X direction and the Y direction, the pair of second-stage ceramic layers sandwiching the second-stage second inner electrode being different from the pair of second-stage ceramic layers sandwiching the second-stage first inner electrode, and when the second-stage ceramic multilayer body is seen through in the Z direction, a first end portion of the second-stage first inner electrode in the X direction is separated from a first end portion of the second-stage ceramic multilayer body in the X direction, at least one of end portions of the second-stage first inner electrode in the Y direction at a second end portion of the second-stage first inner electrode in the X direction is separated from a second end portion of the second-stage ceramic multilayer body in the X direction, a central portion of the second-stage first inner electrode in the Y direction at the second end portion of the second-stage first inner electrode in the X direction overlaps the second end portion of the second-stage ceramic multilayer body in the X direction, at least one of end portions of the second-stage second inner electrode in the Y direction at a first end portion of the second-stage second inner electrode in the X direction is separated from the first end portion of the second-stage ceramic multilayer body in the X direction, a central portion of the second-stage second inner electrode in the Y direction at the first end portion of the second-stage second inner electrode in the X direction overlaps the first end portion of the second-stage ceramic multilayer body in the X direction, and a second end portion of the second-stage second inner electrode in the X direction is separated from the second end portion of the second-stage ceramic multilayer body in the X direction.

6. The second-stage ceramic collective board of claim 5, wherein a distance between the first end portion of the second-stage first inner electrode in the X direction and the first end portion of the second-stage ceramic multilayer body in the X direction is equal to a distance between the second end portion of the second-stage second inner electrode in the X direction and the second end portion of the second-stage ceramic multilayer body.

7. The second-stage ceramic collective board according to claim 5, wherein a length of the second-stage first inner electrodes and a length of the second-stage second inner electrodes are equal.

8. The second-stage ceramic collective board according to claim 5, wherein the second-stage first inner electrodes and the second-stage second inner electrodes are made of metal.

9. A manufacturing method for a second-stage ceramic collective board, comprising:

a step of making a first-stage ceramic collective board; and a step of making a second-stage ceramic collective board, wherein based on an X direction, a Y direction perpendicular to the X direction, and a Z direction perpendicular to the X direction and the Y direction, each of the X direction, the Y direction, and the Z direction having a positive side and a negative side, the first-stage ceramic collective board includes a first-stage ceramic multilayer body, the first-stage ceramic multilayer body includes a plurality of first-stage ceramic layers that extend in the X direction and the Y direction and that are arranged side by side in the Z direction, a plurality of first-stage first inner electrodes that are disposed between a pair of first-stage ceramic layers adjacent to each other in the Z direction among the plurality of first-stage ceramic layers and that extend in the X direction and the Y direction and are arranged side by side in the X direction with a first gap interposed therebetween, the first gap having a width A, and a plurality of first-stage second inner electrodes that are disposed between a pair of first-stage ceramic layers adjacent to each other in the Z direction among the plurality of first-stage ceramic layers and that extend in the X direction and the Y direction and are arranged side by side in the X direction with a second gap interposed therebetween, the second gap having a width B, the pair of first-stage ceramic layers sandwiching the plurality of first-stage second inner electrodes being different from the pair of first-stage ceramic layers sandwiching the plurality of first-stage first inner electrodes, the first-stage first inner electrodes each include a first cutout on at least one of end portions in the Y direction, the first cutout extending in the X direction and the Y direction and having the width B in the X direction, the first-stage second inner electrodes each include a second cutout on at least one of end portions in the Y direction, the second cutout extending in the X direction and the Y direction and having the width A in the X direction, when the first-stage ceramic multilayer body is seen through in the Z direction, there are provided a first region where the first gap and the second cutout overlap each other, and a second region where the second gap and the first cutout overlap each other, the second-stage ceramic collective board is obtained by dividing the first-stage ceramic collective board into a plurality of portions in the Y direction, the second-stage ceramic collective board includes a second-stage ceramic multilayer body constituted by a plurality of second-stage ceramic layers stacked on each other, in the second-stage ceramic collective board, a second-stage first inner electrode is formed between at least one pair of second-stage ceramic layers of the second-stage ceramic multilayer body, and a second-stage second inner electrode is formed between at least one pair of second-stage ceramic layers of the second-stage ceramic multilayer body, the at least one pair of second-stage ceramic layers sandwiching the second-stage first inner electrode being different from the at least one pair of second-stage ceramic layers sandwiching the second-stage second inner electrode, when the first-stage ceramic collective board is seen through in the Z direction, the first region includes a first-region positive side and a first-region negative side, the first-region positive side extending in the Y direction and being positioned on the positive side in the X direction, the first-region negative side extending in the Y direction and being positioned on the negative side in the X direction, the second region includes a second-region positive side and a second-region negative side, the second-region positive side extending in the Y direction and being positioned on the positive side in the X direction, the second-region negative side extending in the Y direction and being positioned on the negative side in the X direction, an imaginary line positioned at an equal distance from the first-region positive side and from the first-region negative side and extending in the Y direction is set to be a first cutting line, and an imaginary line positioned at an equal distance from the second-region positive side and from the second-region negative side and extending in the Y direction is set to be a second cutting line, and the second-stage ceramic collective board is obtained by dividing the first-stage ceramic collective board into a plurality of portions in the Y direction along the first cutting line and the second cutting line.

10. The manufacturing method of claim 9, further comprising:

manufacturing at least one multilayer electronic component by dividing the second-stage ceramic collective board.

11. The manufacturing method of claim 10, wherein the multilayer electronic component is one of a multilayer piezoelectric actuator, multilayer ceramic capacitor, and a multilayer thermistor.

12. The manufacturing method of claim 9, wherein the multilayer electronic component comprises a second-stage first outer electrode connected to the second-stage first inner electrode and a second-stage second outer electrode connected to the second-stage second inner electrode.

13. The manufacturing method of claim 12, wherein each of the second-stage first outer electrode and the second-stage second outer electrode are made of a double layer structure, wherein a first layer of the double layer structure is NiCr and a second layer of the double layer structure is Au.

14. The manufacturing method of claim 12, further comprising:

applying a predetermined voltage between the second-stage first outer electrode and the second-stage second outer electrode such that a polarization direction of outer second-stage ceramic layers becomes opposite a polarization direction of a middle second stage ceramic layer along a thickness direction.

15. The manufacturing method of claim 9, wherein the width A and the width B are equal to each other.

16. The manufacturing method of claim 9, wherein a length of the first-stage first inner electrodes and a length of the first-stage second inner electrodes are equal.

17. The manufacturing method of claim 9, wherein the first-stage first inner electrodes and the first-stage second inner electrodes are made of metal.

18. The manufacturing method of claim 9, wherein a distance between the first end portion of the second-stage first inner electrode in the X direction and the first end portion of the second-stage ceramic multilayer body in the X direction is equal to a distance between the second end portion of the second-stage second inner electrode in the X direction and the second end portion of the second-stage ceramic multilayer body.

19. The manufacturing method of claim 9, wherein a length of the second-stage first inner electrodes and a length of the second-stage second inner electrodes are equal.

20. The manufacturing method of claim 9, wherein the second-stage first inner electrodes and the second-stage second inner electrodes are made of metal.

* * * * *